(12) United States Patent
Das Sharma et al.

(10) Patent No.: US 11,386,033 B2
(45) Date of Patent: Jul. 12, 2022

(54) EXTENDING MULTICHIP PACKAGE LINK OFF PACKAGE

(71) Applicant: Intel Corporation, Santa Clara, CA (US)

(72) Inventors: Debendra Das Sharma, Saratoga, CA (US); Zuoguo Wu, San Jose, CA (US); Mahesh Wagh, Portland, OR (US); Mohiuddin M. Mazumder, San Jose, CA (US); Venkatraman Iyer, Austin, TX (US); Jeff C. Morriss, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/121,534

(22) Filed: Dec. 14, 2020

(65) Prior Publication Data
US 2021/0097015 A1   Apr. 1, 2021

Related U.S. Application Data

(63) Continuation of application No. 16/946,109, filed on Jun. 5, 2020, now Pat. No. 11,113,225, which is a (Continued)

(51) Int. Cl.
*G06F 13/40* (2006.01)
*H01L 25/065* (2006.01)
(Continued)

(52) U.S. Cl.
CPC ........ *G06F 13/4027* (2013.01); *G06F 13/405* (2013.01); *G06F 13/4022* (2013.01);
(Continued)

(58) Field of Classification Search
CPC .................................................. G06F 13/4027
(Continued)

(56) References Cited

U.S. PATENT DOCUMENTS 6,150,724 A * 11/2000 Wenzel ............... H01L 25/0657
257/724
6,202,140 B1   3/2001 Rose et al.
(Continued)

FOREIGN PATENT DOCUMENTS

WO   2014105198 A1   7/2014
WO   2017052575 A1   3/2017

OTHER PUBLICATIONS

International Preliminary Report on Patentability in PCT Patent Application No. PCT/US2015/052160 dated Apr. 5, 2018; 8 pages.
(Continued)

*Primary Examiner* — Titus Wong
(74) *Attorney, Agent, or Firm* — Alliance IP, LLC

(57) ABSTRACT

An interconnect interface is provided to enable communication with an off-package device over a link including a plurality of lanes. Logic of the interconnect interface includes receiver logic to receive a valid signal from the off-package device on a dedicated valid lane of the link indicating that data is to arrive on a plurality of dedicated data lanes in the plurality of lanes, receive the data on the data lanes from the off-package device sampled based on arrival of the valid signal, and receive a stream signal from the off-package device on a dedicated stream lane in the plurality of lanes. The stream signal corresponds to the data and indicates a particular data type of the data. The particular data type can be one of a plurality of different data types capable of being received on the plurality of data lanes of the link.

22 Claims, 24 Drawing Sheets

Related U.S. Application Data continuation of application No. 15/761,401, filed as application No. PCT/US2015/052160 on Sep. 25, 2015, now Pat. No. 10,678,736.

(51) Int. Cl.
*G06F 13/42* (2006.01)
*H01L 23/538* (2006.01)

(52) U.S. Cl.
CPC ...... *G06F 13/4265* (2013.01); *H01L 23/5386* (2013.01); *H01L 25/0655* (2013.01); *H01L 2224/16227* (2013.01); *H01L 2924/15192* (2013.01); *H01L 2924/15311* (2013.01)

(58) Field of Classification Search
USPC ........................................................ 710/306
See application file for complete search history.

(56) References Cited

U.S. PATENT DOCUMENTS

| | | | |
|---|---|---|---|
| 6,215,816 B1* | 4/2001 | Gillespie | H04L 12/44 370/402 |
| 6,810,460 B1 | 10/2004 | Kirkwood | |
| 6,886,057 B2 | 4/2005 | Brewer et al. | |
| 7,321,273 B2 | 1/2008 | Castaneda et al. | |
| 7,471,110 B2 | 12/2008 | Dixit et al. | |
| 7,496,712 B1 | 2/2009 | O'Krafka et al. | |
| 7,958,283 B2* | 6/2011 | Islam | G06F 11/27 710/51 |
| 8,362,587 B2* | 1/2013 | Sellatmamby | H04B 5/0081 257/531 |
| 8,549,205 B1 | 10/2013 | Harriman et al. | |
| 9,607,948 B2* | 3/2017 | Karp | H01L 25/0655 |
| 2005/0237994 A1* | 10/2005 | Fong | H04L 1/1877 370/349 |
| 2007/0198619 A1* | 8/2007 | Kasama | G06F 9/3001 708/200 |
| 2008/0105883 A1* | 5/2008 | Murphy | H01L 23/48 257/81 |
| 2008/0113471 A1* | 5/2008 | Kelly | H01L 25/0655 438/107 |
| 2009/0179334 A1 | 7/2009 | Krishnamoorthy et al. | |
| 2011/0317793 A1 | 12/2011 | Katz et al. | |
| 2013/0007483 A1 | 1/2013 | Diefenbaugh et al. | |
| 2013/0007500 A1 | 1/2013 | Fiedler | |
| 2013/0138858 A1 | 5/2013 | Adler et al. | |
| 2014/0115420 A1* | 4/2014 | Willey | G06F 13/4282 714/758 |
| 2014/0282819 A1 | 9/2014 | Sastry et al. | |
| 2014/0372785 A1 | 12/2014 | Fiedler | |
| 2015/0019788 A1 | 1/2015 | Adler et al. | |
| 2015/0019820 A1 | 1/2015 | Prasky et al. | |
| 2015/0130658 A1 | 5/2015 | Hennegan | |
| 2015/0269108 A1 | 9/2015 | Spry et al. | |
| 2016/0034025 A1* | 2/2016 | Dabral | G06F 1/3296 710/313 |
| 2016/0197761 A1 | 7/2016 | Chang et al. | |

OTHER PUBLICATIONS

International Search Report and Written Opinion in PCT Patent Application No. PCT/US2015/052160 dated Jun. 24, 2016; 9 pages.
German Patent Office; Office Action issued in DE Patent Application No. 112015006944.5, dated Dec. 8, 2021; 19 pages.
German Patent Office; Office Action issued in DE Patent Application No. 112015007276.4, dated Dec. 20, 2021; 12 pages.
German Patent Office; Office Action issued in DE Patent Application No. 112015007278.0, dated Dec. 10, 2021; 17 pages.

* cited by examiner

| | | Lanes | | | | | | | | | | | | | | | | |
|---|---|---|---|---|---|---|---|---|---|---|---|---|---|---|---|---|---|---|
| | | 49 | 48 | 47 | 46 | 45 | 44 | 43 | 42 | 41 | 40 | 39 | 38 | 37 | 36 | 35 | 34 | 33 | 32 |
| UI | 1 | 392 | 384 | 376 | 368 | 360 | 352 | 344 | 336 | 328 | 320 | 312 | 304 | 296 | 288 | 280 | 272 | 264 | 256 |
| | 2 | 393 | 385 | 377 | 369 | 361 | 353 | 345 | 337 | 329 | 321 | 313 | 305 | 297 | 289 | 281 | 273 | 265 | 257 |
| | 3 | 394 | 386 | 378 | 370 | 362 | 354 | 346 | 338 | 330 | 322 | 314 | 306 | 298 | 290 | 282 | 274 | 266 | 258 |
| | 4 | 395 | 387 | 379 | 371 | 363 | 355 | 347 | 339 | 331 | 323 | 315 | 307 | 299 | 291 | 283 | 275 | 267 | 259 |
| | 5 | 396 | 388 | 380 | 372 | 364 | 356 | 348 | 340 | 332 | 324 | 316 | 308 | 300 | 292 | 284 | 276 | 268 | 260 |
| | 6 | 397 | 389 | 381 | 373 | 365 | 357 | 349 | 341 | 333 | 325 | 317 | 309 | 301 | 293 | 285 | 277 | 269 | 261 |
| | 7 | 398 | 390 | 382 | 374 | 366 | 358 | 350 | 342 | 334 | 326 | 318 | 310 | 302 | 294 | 286 | 278 | 270 | 262 |
| | 8 | 399 | 391 | 383 | 375 | 367 | 359 | 351 | 343 | 335 | 327 | 319 | 311 | 303 | 295 | 287 | 279 | 271 | 263 |
| | CRC | Header Slot Type | | | | | | | | | | | | | | | | | |
| | | 168 | | | | | | | | | | | | | | | | | |

| | | Lanes | | | | | | | | | | | | | | | |
|---|---|---|---|---|---|---|---|---|---|---|---|---|---|---|---|---|---|
| | | 31 | 30 | 29 | 28 | 27 | 26 | 25 | 24 | 23 | 22 | 21 | 20 | 19 | 18 | 17 | 16 |
| UI | 1 | 248 | 240 | 232 | 224 | 216 | 208 | 200 | 192 | 184 | 176 | 168 | 160 | 152 | 144 | 136 | 128 |
| | 2 | 249 | 241 | 233 | 225 | 217 | 209 | 201 | 193 | 185 | 177 | 169 | 161 | 153 | 145 | 137 | 129 |
| | 3 | 250 | 242 | 234 | 226 | 218 | 210 | 202 | 194 | 186 | 178 | 170 | 162 | 154 | 146 | 138 | 130 |
| | 4 | 251 | 243 | 235 | 227 | 219 | 211 | 203 | 195 | 187 | 179 | 171 | 163 | 155 | 147 | 139 | 131 |
| | 5 | 252 | 244 | 236 | 228 | 220 | 212 | 204 | 196 | 188 | 180 | 172 | 164 | 156 | 148 | 140 | 132 |
| | 6 | 253 | 245 | 237 | 229 | 221 | 213 | 205 | 197 | 189 | 181 | 173 | 165 | 157 | 149 | 141 | 133 |
| | 7 | 254 | 246 | 238 | 230 | 222 | 214 | 206 | 198 | 190 | 182 | 174 | 166 | 158 | 150 | 142 | 134 |
| | 8 | 255 | 247 | 239 | 231 | 223 | 215 | 207 | 199 | 191 | 183 | 175 | 167 | 159 | 151 | 143 | 135 |
| | | Generic Slot Type | | | | | | | | | | | | | | | |
| | | 168 | | | | | | | | | | | | | | | |

| | | Lanes | | | | | | | | | | | | | | | |
|---|---|---|---|---|---|---|---|---|---|---|---|---|---|---|---|---|---|
| | | 15 | 14 | 13 | 12 | 11 | 10 | 9 | 8 | 7 | 6 | 5 | 4 | 3 | 2 | 1 | 0 |
| UI | 1 | 120 | 112 | 104 | 96 | 88 | 80 | 72 | 64 | 56 | 48 | 40 | 32 | 24 | 16 | 8 | 0 |
| | 2 | 121 | 113 | 105 | 97 | 89 | 81 | 73 | 65 | 57 | 49 | 41 | 33 | 25 | 17 | 9 | 1 |
| | 3 | 122 | 114 | 106 | 98 | 90 | 82 | 74 | 66 | 58 | 50 | 42 | 34 | 26 | 18 | 10 | 2 |
| | 4 | 123 | 115 | 107 | 99 | 91 | 83 | 75 | 67 | 59 | 51 | 43 | 35 | 27 | 19 | 11 | 3 |
| | 5 | 124 | 116 | 108 | 100 | 92 | 84 | 76 | 68 | 60 | 52 | 44 | 36 | 28 | 20 | 12 | 4 |
| | 6 | 125 | 117 | 109 | 101 | 93 | 85 | 77 | 69 | 61 | 53 | 45 | 37 | 29 | 21 | 13 | 5 |
| | 7 | 126 | 118 | 110 | 102 | 94 | 86 | 78 | 70 | 62 | 54 | 46 | 38 | 30 | 22 | 14 | 6 |
| | 8 | 127 | 119 | 111 | 103 | 95 | 87 | 79 | 71 | 63 | 55 | 47 | 39 | 31 | 23 | 15 | 7 |
| | | Generic Slot Type | | | | | | | | | | | | | | | |
| | | 168 | | | | | | | | | | | | | | | |

*FIG. 14A*

Table 1 (Lanes 24-49)

| UI | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 |
|---|---|---|---|---|---|---|---|---|---|---|---|---|---|---|---|---|---|---|---|---|---|---|---|---|---|---|
| 1 | 192 | 200 | 208 | 216 | 224 | 232 | 240 | 248 | 256 | 264 | 272 | 280 | 288 | 296 | 304 | 312 | 320 | 328 | 336 | 344 | 352 | 360 | 368 | 376 | 0 | 0 |
| 2 | 193 | 201 | 209 | 217 | 225 | 233 | 241 | 249 | 257 | 265 | 273 | 281 | 289 | 297 | 305 | 313 | 321 | 329 | 337 | 345 | 353 | 361 | 369 | 377 | 0 | 0 |
| 3 | 194 | 202 | 210 | 218 | 226 | 234 | 242 | 250 | 258 | 266 | 274 | 282 | 290 | 298 | 306 | 314 | 322 | 330 | 338 | 346 | 354 | 362 | 370 | 378 | 0 | 0 |
| 4 | 195 | 203 | 211 | 219 | 227 | 235 | 243 | 251 | 259 | 267 | 275 | 283 | 291 | 299 | 307 | 315 | 323 | 331 | 339 | 347 | 355 | 363 | 371 | 379 | 0 | 0 |
| 5 | 196 | 204 | 212 | 220 | 228 | 236 | 244 | 252 | 260 | 268 | 276 | 284 | 292 | 300 | 308 | 316 | 324 | 332 | 340 | 348 | 356 | 364 | 372 | 380 | 0 | 0 |
| 6 | 197 | 205 | 213 | 221 | 229 | 237 | 245 | 253 | 261 | 269 | 277 | 285 | 293 | 301 | 309 | 317 | 325 | 333 | 341 | 349 | 357 | 365 | 373 | 381 | 0 | 0 |
| 7 | 198 | 206 | 214 | 222 | 230 | 238 | 246 | 254 | 262 | 270 | 278 | 286 | 294 | 302 | 310 | 318 | 326 | 334 | 342 | 350 | 358 | 366 | 374 | 382 | 0 | 0 |
| 8 | 199 | 207 | 215 | 223 | 231 | 239 | 247 | 255 | 263 | 271 | 279 | 287 | 295 | 303 | 311 | 319 | 327 | 335 | 343 | 351 | 359 | 367 | 375 | 383 | 0 | NA |

Packet(s)

Table 2 (Lanes 0-23)

| UI | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 1 | 0 | 8 | 16 | 24 | 32 | 40 | 48 | 56 | 64 | 72 | 80 | 88 | 96 | 104 | 112 | 120 | 128 | 136 | 144 | 152 | 160 | 168 | 176 | 184 |
| 2 | 0 | 8 | 17 | 25 | 33 | 41 | 49 | 57 | 65 | 73 | 81 | 89 | 97 | 105 | 113 | 121 | 129 | 137 | 145 | 153 | 161 | 169 | 177 | 185 |
| 3 | 1 | 9 | 17 | 25 | 33 | 41 | 49 | 57 | 65 | 73 | 81 | 89 | 97 | 105 | 113 | 121 | 129 | 137 | 145 | 153 | 161 | 169 | 177 | 185 |
| 4 | 2 | 10 | 18 | 26 | 34 | 42 | 50 | 58 | 66 | 74 | 82 | 90 | 98 | 106 | 114 | 122 | 130 | 138 | 146 | 154 | 162 | 170 | 178 | 186 |
| 5 | 3 | 11 | 19 | 27 | 35 | 43 | 51 | 59 | 67 | 75 | 83 | 91 | 99 | 107 | 115 | 123 | 131 | 139 | 147 | 155 | 163 | 171 | 179 | 187 |
| 6 | 4 | 12 | 20 | 28 | 36 | 44 | 52 | 60 | 68 | 76 | 84 | 92 | 100 | 108 | 116 | 124 | 132 | 140 | 148 | 156 | 164 | 172 | 180 | 188 |
| 7 | 5 | 13 | 21 | 29 | 37 | 45 | 53 | 61 | 69 | 77 | 85 | 93 | 101 | 109 | 117 | 125 | 133 | 141 | 149 | 157 | 165 | 173 | 181 | 189 |
| 8 | 6 | 14 | 22 | 30 | 38 | 46 | 54 | 62 | 70 | 78 | 86 | 94 | 102 | 110 | 118 | 126 | 134 | 142 | 150 | 158 | 166 | 174 | 182 | 190 |
| | 7 | 15 | 23 | 31 | 39 | 47 | 55 | 63 | 71 | 79 | 87 | 95 | 103 | 111 | 119 | 127 | 135 | 143 | 151 | 159 | 167 | 175 | 183 | 191 |

Packet(s)

| UI | 49 | 48 | 47 | 46 | 45 | 44 | 43 | 42 | 41 | 40 | 39 | 38 | 37 | 36 | 35 | 34 | 33 | 32 | 31 | 30 | 29 | 28 | 27 | 26 | 25 | 24 |
|---|---|---|---|---|---|---|---|---|---|---|---|---|---|---|---|---|---|---|---|---|---|---|---|---|---|---|
| 1 | 0 | 0 | 376 | 368 | 360 | 352 | 344 | 336 | 328 | 320 | 312 | 304 | 296 | 288 | 280 | 272 | 264 | 256 | 248 | 240 | 232 | 224 | 216 | 208 | 200 | 192 |
| 2 | 0 | 0 | 377 | 369 | 361 | 353 | 345 | 337 | 329 | 321 | 313 | 305 | 297 | 289 | 281 | 273 | 265 | 257 | 249 | 241 | 233 | 225 | 217 | 209 | 201 | 193 |
| 3 | 0 | 0 | 378 | 370 | 362 | 354 | 346 | 338 | 330 | 322 | 314 | 306 | 298 | 290 | 282 | 274 | 266 | 258 | 250 | 242 | 234 | 226 | 218 | 210 | 202 | 194 |
| 4 | 0 | 0 | 379 | 371 | 363 | 355 | 347 | 339 | 331 | 323 | 315 | 307 | 299 | 291 | 283 | 275 | 267 | 259 | 251 | 243 | 235 | 227 | 219 | 211 | 203 | 195 |
| 5 | 0 | 0 | 380 | 372 | 364 | 356 | 348 | 340 | 332 | 324 | 316 | 308 | 300 | 292 | 284 | 276 | 268 | 260 | 252 | 244 | 236 | 228 | 220 | 212 | 204 | 196 |
| 6 | 0 | 0 | 381 | 373 | 365 | 357 | 349 | 341 | 333 | 325 | 317 | 309 | 301 | 293 | 285 | 277 | 269 | 261 | 253 | 245 | 237 | 229 | 221 | 213 | 205 | 197 |
| 7 | 0 | 0 | 382 | 374 | 366 | 358 | 350 | 342 | 334 | 326 | 318 | 310 | 302 | 294 | 286 | 278 | 270 | 262 | 254 | 246 | 238 | 230 | 222 | 214 | 206 | 198 |
| 8 | 0 | 0 | 383 | 375 | 367 | 359 | 351 | 343 | 335 | 327 | 319 | 311 | 303 | 295 | 287 | 279 | 271 | 263 | 255 | 247 | 239 | 231 | 223 | 215 | 207 | 199 |
|   | NA | LLP1 | LLP2 | LLP2 | LLP2 | | | LLP2 | | | | LLP2 | | | | LLP2 | | | | LLP1 | | | | LLP1 | | |

| UI | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| 1 | 184 | 176 | 168 | 160 | 152 | 144 | 136 | 128 | 120 | 112 | 104 | 96 | 88 | 80 | 72 | 64 | 56 | 48 | 40 | 32 | 24 | 16 | 8 | 0 |
| 2 | 185 | 177 | 169 | 161 | 153 | 145 | 137 | 129 | 121 | 113 | 105 | 97 | 89 | 81 | 73 | 65 | 57 | 49 | 41 | 33 | 25 | 17 | 9 | 0 |
| 3 | 186 | 178 | 170 | 162 | 154 | 146 | 138 | 130 | 122 | 114 | 106 | 98 | 90 | 82 | 74 | 66 | 58 | 50 | 42 | 34 | 26 | 18 | 10 | 1 |
| 4 | 187 | 179 | 171 | 163 | 155 | 147 | 139 | 131 | 123 | 115 | 107 | 99 | 91 | 83 | 75 | 67 | 59 | 51 | 43 | 35 | 27 | 19 | 11 | 2 |
| 5 | 188 | 180 | 172 | 164 | 156 | 148 | 140 | 132 | 124 | 116 | 108 | 100 | 92 | 84 | 76 | 68 | 60 | 52 | 44 | 36 | 28 | 20 | 12 | 3 |
| 6 | 189 | 181 | 173 | 165 | 157 | 149 | 141 | 133 | 125 | 117 | 109 | 101 | 93 | 85 | 77 | 69 | 61 | 53 | 45 | 37 | 29 | 21 | 13 | 4 |
| 7 | 190 | 182 | 174 | 166 | 158 | 150 | 142 | 134 | 126 | 118 | 110 | 102 | 94 | 86 | 78 | 70 | 62 | 54 | 46 | 38 | 30 | 22 | 14 | 5 |
| 8 | 191 | 183 | 175 | 167 | 159 | 151 | 143 | 135 | 127 | 119 | 111 | 103 | 95 | 87 | 79 | 71 | 63 | 55 | 47 | 39 | 31 | 23 | 15 | 7 |
|   | LLP1 | | | | LLP1 | | | | LLP0 | | | | LLP0 | | | | LLP0 | | | | LLP0 | | | |

//

EXTENDING MULTICHIP PACKAGE LINK OFF PACKAGE

CROSS-REFERENCE TO RELATED APPLICATIONS

This application is a continuation (and claims the benefit of priority under 35 U.S.C. § 120) of U.S. patent application Ser. No. 16/946,109, filed Jun. 5, 2020, and entitled "Extending Multichip Package Link Off Package", which is a continuation of U.S. patent application Ser. No. 15/761,401, filed Mar. 19, 2018, now U.S. Pat. No. 10,678,736, issued Jun. 9, 2020, and entitled "Extending Multichip Package Link Off Package", which is a national stage application under 35 U.S.C. § 371 of PCT International Application Serial No. PCT/US2015/052160, filed on Sep. 25, 2015, and entitled "Extending Multichip Package Link Off Package". The disclosures of the prior applications are considered part of and are hereby incorporated by reference in their entirety in the disclosure of this application.

FIELD

This disclosure pertains to computing system, and in particular (but not exclusively) to point-to-point interconnects.

BACKGROUND

Advances in semi-conductor processing and logic design have permitted an increase in the amount of logic that may be present on integrated circuit devices. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically comprises a single physical processor die, where the processor die may include any number of cores, hardware threads, logical processors, interfaces, memory, controller hubs, etc.

As a result of the greater ability to fit more processing power in smaller packages, smaller computing devices have increased in popularity. Smartphones, tablets, ultrathin notebooks, and other user equipment have grown exponentially. However, these smaller devices are reliant on servers both for data storage and complex processing that exceeds the form factor. Consequently, the demand in the high-performance computing market (i.e. server space) has also increased. For instance, in modern servers, there is typically not only a single processor with multiple cores, but also multiple physical processors (also referred to as multiple sockets) to increase the computing power. But as the processing power grows along with the number of devices in a computing system, the communication between sockets and other devices becomes more critical.

In fact, interconnects have grown from more traditional multi-drop buses that primarily handled electrical communications to full blown interconnect architectures that facilitate fast communication. Unfortunately, as the demand for future processors to consume at even higher-rates corresponding demand is placed on the capabilities of existing interconnect architectures.

BRIEF DESCRIPTION OF THE DRAWINGS

FIGS. 14A-14C are example bit mappings of data on lanes of an example MCPL.

Like reference numbers and designations in the various drawings indicate like elements.

DETAILED DESCRIPTION

Figure 1:
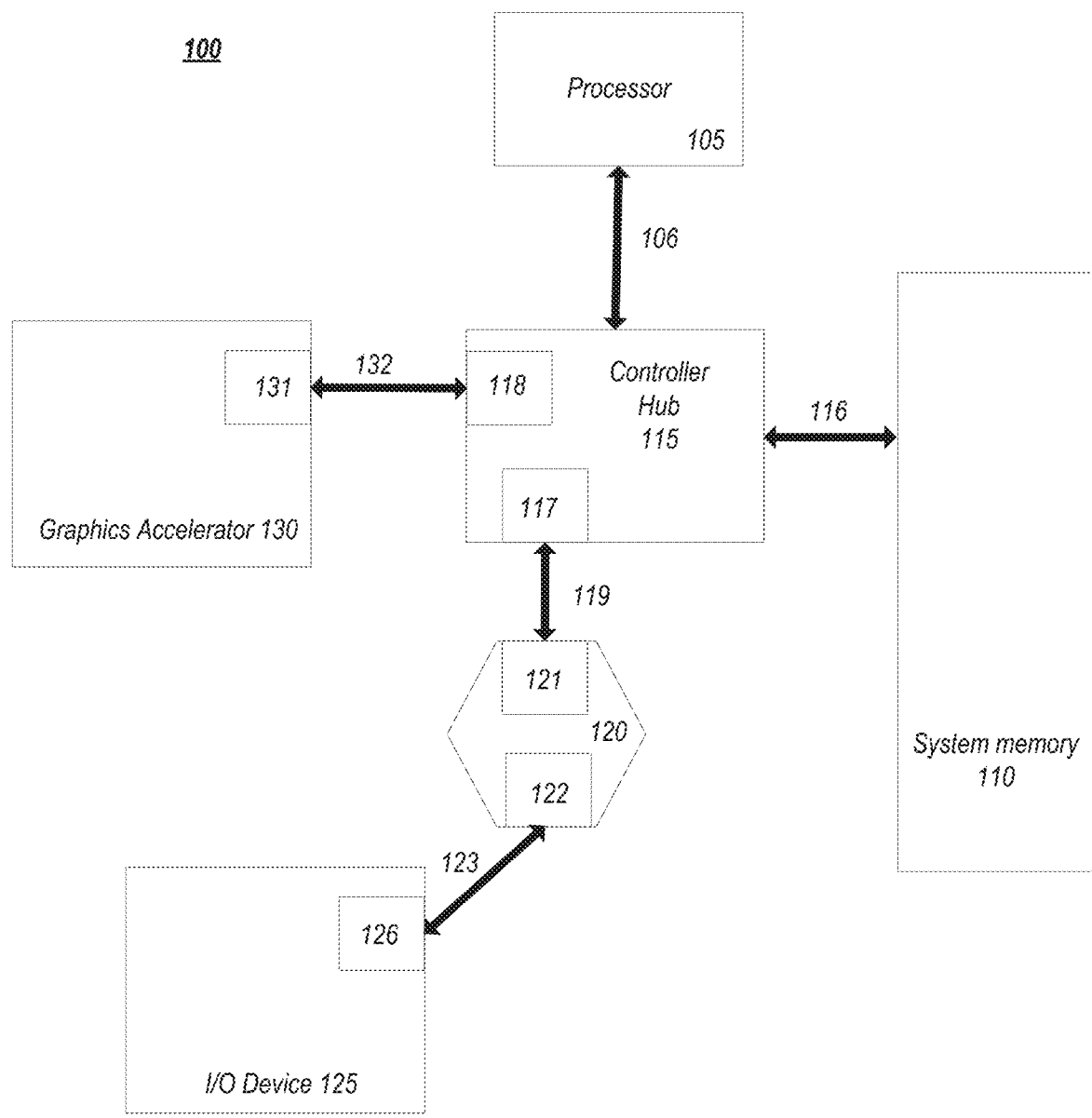
FIG. 1 illustrates an embodiment of a computing system including an interconnect architecture.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

One interconnect fabric architecture includes the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Referring to FIG. 1, an embodiment of a fabric composed of point-to-point Links that interconnect a set of components is illustrated. System 100 includes processor 105 and system memory 110 coupled to controller hub 115. Processor 105 includes any processing element, such as a microprocessor, a host processor, an embedded processor, a co-processor, or other processor. Processor 105 is coupled to controller hub 115 through front-side bus (FSB) 106. In one embodiment, FSB 106 is a serial point-to-point interconnect as described below. In another embodiment, link 106 includes a serial, differential interconnect architecture that is compliant with different interconnect standard.

System memory 110 includes any memory device, such as random access memory (RAM), non-volatile (NV) memory, or other memory accessible by devices in system 100. System memory 110 is coupled to controller hub 115 through memory interface 116. Examples of a memory interface include a double-data rate (DDR) memory interface, a dual-channel DDR memory interface, and a dynamic RAM (DRAM) memory interface.

In one embodiment, controller hub 115 is a root hub, root complex, or root controller in a Peripheral Component Interconnect Express (PCIe or PCIE) interconnection hierarchy. Examples of controller hub 115 include a chipset, a memory controller hub (MCH), a northbridge, an interconnect controller hub (ICH), a southbridge, and a root controller/hub. Often the term chipset refers to two physically separate controller hubs, i.e. a memory controller hub (MCH) coupled to an interconnect controller hub (ICH). Note that current systems often include the MCH integrated with processor 105, while controller 115 is to communicate with I/O devices, in a similar manner as described below. In some embodiments, peer-to-peer routing is optionally supported through root complex 115.

Here, controller hub 115 is coupled to switch/bridge 120 through serial link 119. Input/output modules 117 and 121, which may also be referred to as interfaces/ports 117 and 121, include/implement a layered protocol stack to provide communication between controller hub 115 and switch 120. In one embodiment, multiple devices are capable of being coupled to switch 120.

Switch/bridge 120 routes packets/messages from device 125 upstream, i.e. up a hierarchy towards a root complex, to controller hub 115 and downstream, i.e. down a hierarchy away from a root controller, from processor 105 or system memory 110 to device 125. Switch 120, in one embodiment, is referred to as a logical assembly of multiple virtual PCI-to-PCI bridge devices. Device 125 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 125 may include a PCIe to PCI/PCI-X bridge to support legacy or other version PCI devices.

Endpoint devices in PCIe are often classified as legacy, PCIe, or root complex integrated endpoints.

Graphics accelerator 130 is also coupled to controller hub 115 through serial link 132. In one embodiment, graphics accelerator 130 is coupled to an MCH, which is coupled to an ICH. Switch 120, and accordingly I/O device 125, is then coupled to the ICH. I/O modules 131 and 118 are also to implement a layered protocol stack to communicate between graphics accelerator 130 and controller hub 115. Similar to the MCH discussion above, a graphics controller or the graphics accelerator 130 itself may be integrated in processor 105.

Figure 2:
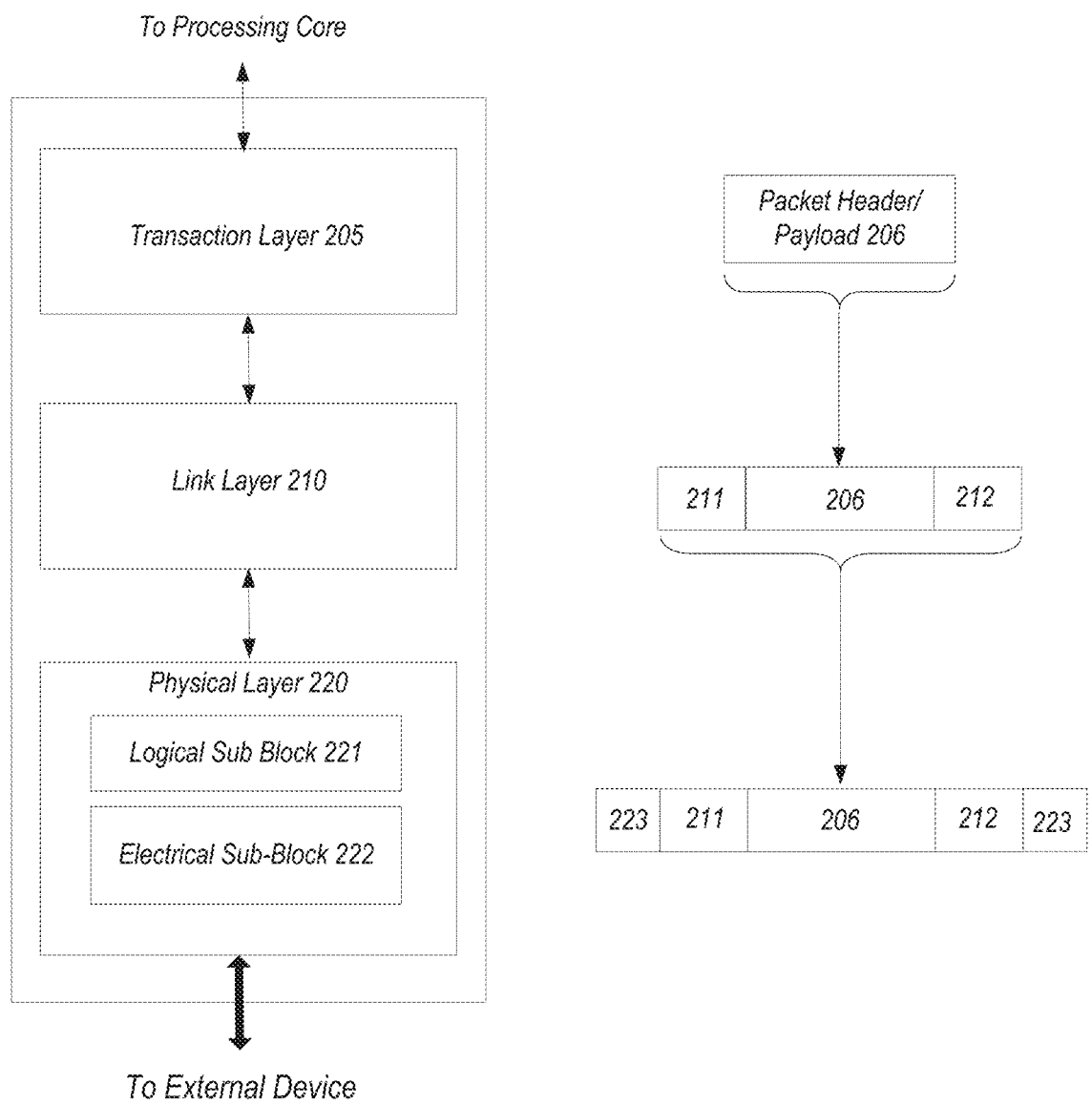
FIG. 2 illustrates an embodiment of a interconnect architecture including a layered stack.

Turning to FIG. 2 an embodiment of a layered protocol stack is illustrated. Layered protocol stack 200 includes any form of a layered communication stack, such as a Quick Path Interconnect (QPI) stack, a PCie stack, a next generation high performance computing interconnect stack, or other layered stack. Although the discussion immediately below in reference to FIGS. 1-4 are in relation to a PCIe stack, the same concepts may be applied to other interconnect stacks. In one embodiment, protocol stack 200 is a PCIe protocol stack including transaction layer 205, link layer 210, and physical layer 220. An interface, such as interfaces 117, 118, 121, 122, 126, and 131 in FIG. 1, may be represented as communication protocol stack 200. Representation as a communication protocol stack may also be referred to as a module or interface implementing/including a protocol stack.

PCI Express uses packets to communicate information between components. Packets are formed in the Transaction Layer 205 and Data Link Layer 210 to carry the information from the transmitting component to the receiving component. As the transmitted packets flow through the other layers, they are extended with additional information necessary to handle packets at those layers. At the receiving side the reverse process occurs and packets get transformed from their Physical Layer 220 representation to the Data Link Layer 210 representation and finally (for Transaction Layer Packets) to the form that can be processed by the Transaction Layer 205 of the receiving device.

Transaction Layer

In one embodiment, transaction layer 205 is to provide an interface between a device's processing core and the interconnect architecture, such as data link layer 210 and physical layer 220. In this regard, a primary responsibility of the transaction layer 205 is the assembly and disassembly of packets (i.e., transaction layer packets, or TLPs). The translation layer 205 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 205. An external device at the opposite end of the link, such as controller hub 115 in FIG. 1, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message space transactions (or, simply messages) are defined to support in-band communication between PCIe agents.

Therefore, in one embodiment, transaction layer 205 assembles packet header/payload 206. Format for current packet headers/payloads may be found in the PCIe specification at the PCIe specification website.

Figure 3:
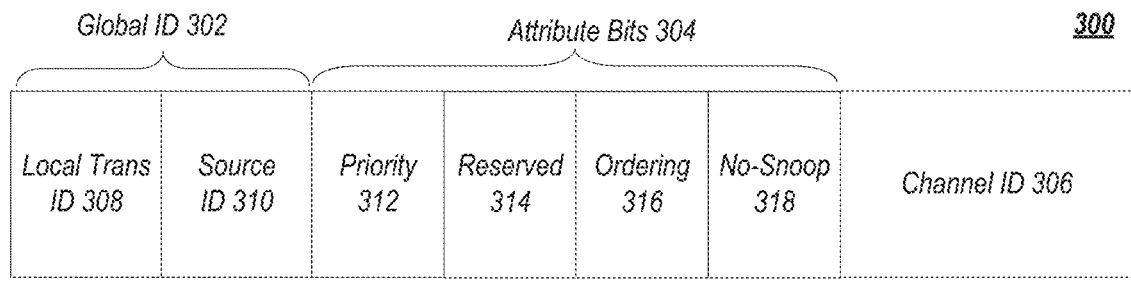
FIG. 3 illustrates an embodiment of a request or packet to be generated or received within an interconnect architecture.

Quickly referring to FIG. 3, an embodiment of a PCIe transaction descriptor is illustrated. In one embodiment, transaction descriptor 300 is a mechanism for carrying transaction information. In this regard, transaction descriptor 300 supports identification of transactions in a system. Other potential uses include tracking modifications of default transaction ordering and association of transaction with channels.

Transaction descriptor 300 includes global identifier field 302, attributes field 304 and channel identifier field 306. In the illustrated example, global identifier field 302 is depicted comprising local transaction identifier field 308 and source identifier field 310. In one embodiment, global transaction identifier 302 is unique for all outstanding requests.

According to one implementation, local transaction identifier field 308 is a field generated by a requesting agent, and it is unique for all outstanding requests that require a completion for that requesting agent. Furthermore, in this example, source identifier 310 uniquely identifies the requestor agent within a PCIe hierarchy. Accordingly, together with source ID 310, local transaction identifier 308 field provides global identification of a transaction within a hierarchy domain.

Attributes field 304 specifies characteristics and relationships of the transaction. In this regard, attributes field 304 is potentially used to provide additional information that allows modification of the default handling of transactions. In one embodiment, attributes field 304 includes priority field 312, reserved field 314, ordering field 316, and no-snoop field 318. Here, priority sub-field 312 may be modified by an initiator to assign a priority to the transaction. Reserved attribute field 314 is left reserved for future, or vendor-defined usage. Possible usage models using priority or security attributes may be implemented using the reserved attribute field.

In this example, ordering attribute field 316 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 318 is utilized to determine if transactions are snooped. As shown, channel ID Field 306 identifies a channel that a transaction is associated with.

Link Layer

Link layer 210, also referred to as data link layer 210, acts as an intermediate stage between transaction layer 205 and the physical layer 220. In one embodiment, a responsibility of the data link layer 210 is providing a reliable mechanism for exchanging Transaction Layer Packets (TLPs) between two components a link. One side of the Data Link Layer 210 accepts TLPs assembled by the Transaction Layer 205, applies packet sequence identifier 211, i.e. an identification number or packet number, calculates and applies an error detection code, i.e. CRC 212, and submits the modified TLPs to the Physical Layer 220 for transmission across a physical to an external device.

Physical Layer

In one embodiment, physical layer 220 includes logical sub block 221 and electrical sub-block 222 to physically transmit a packet to an external device. Here, logical sub-block 221 is responsible for the "digital" functions of Physical Layer 221. In this regard, the logical sub-block includes a transmit section to prepare outgoing information for transmission by physical sub-block 222, and a receiver section to identify and prepare received information before passing it to the Link Layer 210.

Physical block 222 includes a transmitter and a receiver. The transmitter is supplied by logical sub-block 221 with symbols, which the transmitter serializes and transmits onto to an external device. The receiver is supplied with serialized symbols from an external device and transforms the received signals into a bit-stream. The bit-stream is de-serialized and supplied to logical sub-block 221. In one embodiment, an 8b/10b transmission code is employed, where ten-bit symbols are transmitted/received. Here, special symbols are used to frame a packet with frames 223. In addition, in one example, the receiver also provides a symbol clock recovered from the incoming serial stream.

As stated above, although transaction layer 205, link layer 210, and physical layer 220 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 4:
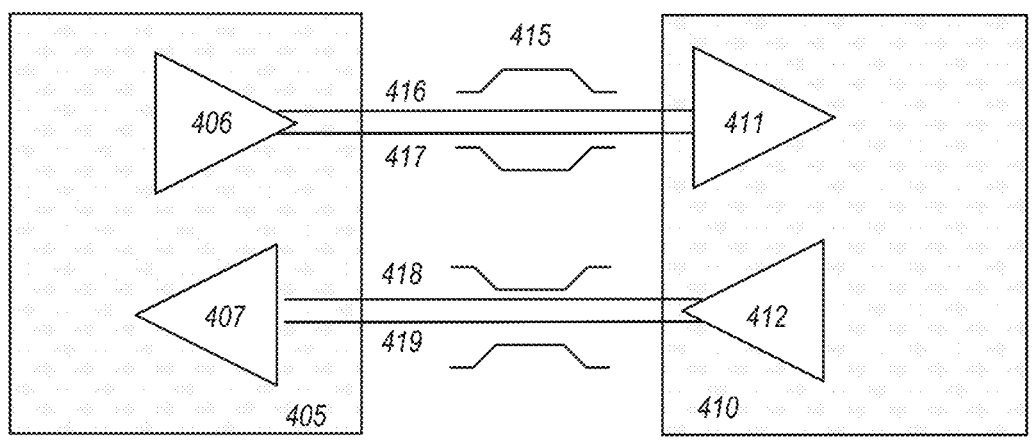
FIG. 4 illustrates an embodiment of a transmitter and receiver pair for an interconnect architecture.

Referring next to FIG. 4, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 406/411 and a receive pair 412/407. Accordingly, device 405 includes transmission logic 406 to transmit data to device 410 and receiving logic 407 to receive data from device 410. In other words, two transmitting paths, i.e. paths 416 and 417, and two receiving paths, i.e. paths 418 and 419, are included in a PCIe link.

A transmission path refers to any path for transmitting data, such as a transmission line, a copper line, an optical line, a wireless communication channel, an infrared communication link, or other communication path. A connection between two devices, such as device 405 and device 410, is referred to as a link, such as link 415. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 416 and 417, to transmit differential signals. As an example, when line 416 toggles from a low voltage level to a high voltage level, i.e. a rising edge, line 417 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

Figure 5A:
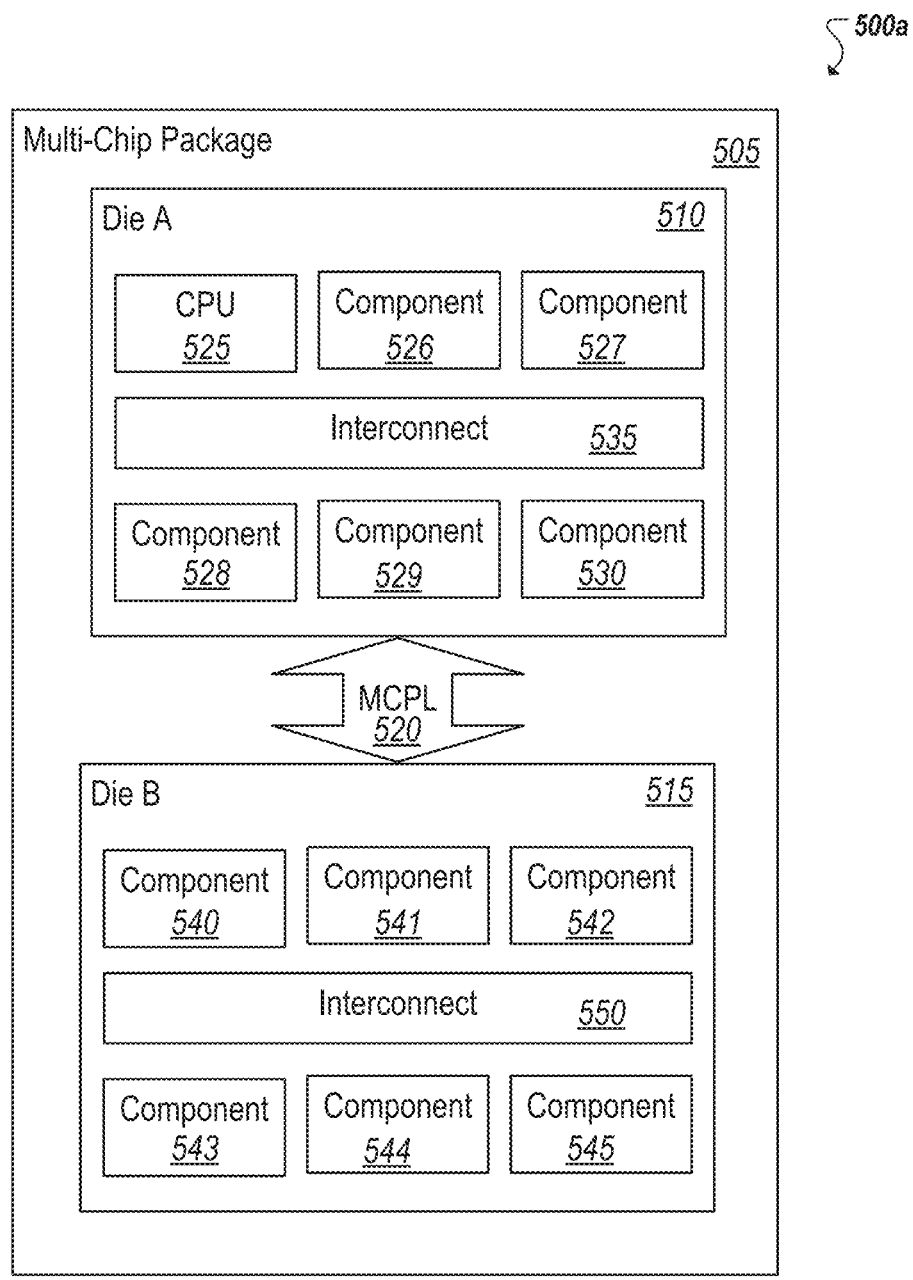
FIG. 5A illustrates an embodiment of a multichip package.
Figure 5B:
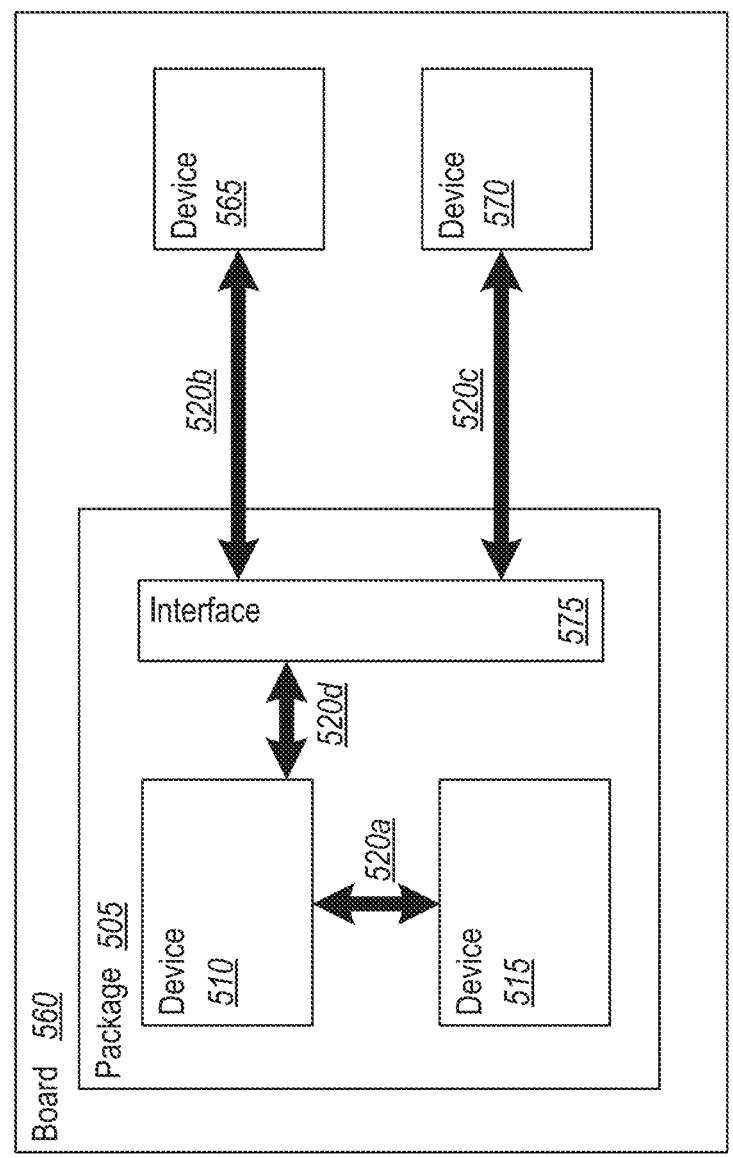
FIG. 5B illustrates an embodiment of a multichip package interconnected with at least one off-package device.

FIG. 5A is a simplified block diagram 500a illustrating an example multi-chip package 505 that includes two or more chips, or dies, (e.g., 510, 515) communicatively connected using an example multi-chip package link (MCPL) 520. While FIG. 5 illustrates an example of two (or more) dies that are interconnected using an example MCPL 520, it should be appreciated that the principles and features described herein regarding implementations of an MCPL can be applied to any interconnect or link connecting a die (e.g., 510) and other components, including connecting two or more dies (e.g., 510, 515), connecting a die (or chip) to another component off-die, connecting a die to another device or die off-package, connecting die to a BGA package, implementation of a Patch on Interposer (POINT), among potentially other examples. For instance, FIG. 5B, illustrates an implementation where an MCPL can be extended from an on-package interconnection (as shown in FIG. 5A) to include links connecting two devices not included on the same package.

Continuing with the example of FIG. 5A, generally, a multichip package (e.g., 505) can be an electronic package where multiple integrated circuits (ICs), semiconductor dies or other discrete components (e.g., 510, 515) are packaged onto a unifying substrate (e.g., silicon or other semiconductor substrate), facilitating the combined components' use as a single component (e.g., as though a larger IC). In some instances, the larger components (e.g., dies 510, 515) can themselves be IC systems, such as systems on chip (SoC), multiprocessor chips, or other components that include multiple components (e.g., 525-530 and 540-545) on the device, for instance, on a single die (e.g., 510, 515). Multichip packages 505 can provide flexibility for building complex and varied systems from potentially multiple discrete components and systems. For instance, each of dies 510, 515 may be manufactured or otherwise provided by two different entities, with the silicon substrate of the package 505 provided by yet a third entity, among many other examples. Further, dies and other components within a multichip package 505 can themselves include interconnect or other communication fabrics (e.g., 535, 550) providing the infrastructure for communication between components (e.g., 525-530 and 540-545) within the device (e.g., 510, 515 respectively). The various components and interconnects (e.g., 535, 550) may potentially support or use multiple different protocols. Further, communication between dies (e.g., 510, 515) can potentially include transactions between the various components on the dies over multiple different protocols. Designing mechanisms to provide communication between chips (or dies) on a multichip package can be challenging, with traditional solutions employing highly specialized, expensive, and package-specific solutions based on the specific combinations of components (and desired transactions) sought to be interconnected.

The examples, systems, algorithms, apparatus, logic, and features described within this Specification can address at least some of the issues identified above, including potentially many others not explicitly mentioned herein. For instance, in some implementations, a high bandwidth, low power, low latency interface can be provided to connect a host device (e.g., a CPU) or other device to a companion chip that sits in the same package as the host. Such a multichip package link (MCPL) can support multiple package options, multiple I/O protocols, as well as Reliability, Availability, and Serviceability (RAS) features. Further, the physical layer (PHY) can include an electrical layer and logic layer and can support longer channel lengths, including channel lengths up to, and in some cases exceeding, approximately 45 mm. In some implementations, an example MCPL can operate at high data rates, including data rates exceeding 8-10 Gb/s.

In one example implementation of an MCPL, a PHY electrical layer can improve upon traditional multi-channel interconnect solutions (e.g., multi-channel DRAM I/O), extending the data rate and channel configuration, for instance, by a number of features including, as examples, regulated mid-rail termination, low power active crosstalk cancellation, circuit redundancy, per bit duty cycle correction and deskew, line coding, and transmitter equalization, among potentially other examples.

In one example implementation of an MCPL, a PHY logical layer can be implemented that can further assist (e.g., electrical layer features) in extending the data rate and channel configuration while also enabling the interconnect to route multiple protocols across the electrical layer. Such implementations can provide and define a modular common physical layer that is protocol agnostic and architected to work with potentially any existing or future interconnect protocol.

Turning to the simplified block diagram 500b shown in FIG. 5B, multi-protocol, time-multiplexed MCPLs (e.g., 520a) can be utilized to not only interconnect two or more components, or devices, (e.g., 510, 515) on the same package (e.g., 505), but the (hardware and/or software) logic used to implement MCPLs can also be utilized to connect devices not located on the same package. Such links can be physically longer than those interconnecting components in close proximity within a single package. As one example, a package device 505 can interconnect with one or more other devices (e.g., 560, 565) provided on a board 570 with the package device 505. One or more interfaces 575 can be provided on the package to acts as a slot through which the functionality and components of the package 505 can be extended to incorporate additional off-package components (e.g., 560, 565). The interface can include logic identical to, or similar to, that utilized in the on-package components supporting MCPLs (e.g., 520a). According, corresponding MCPLs (e.g., 520b, 520c) can be provided to connect the interface(s) 575 with off-package components 565, 570 and support multi-protocol, time-multiplexed data between the package 505 and the components 565, 570. In some implementations, the interface(s) 575 can be further interconnected with on-package components (e.g., 510, 515) using similar instances of MCPLs (e.g., 520d), among other example implementations and architectures.

Figure 6:
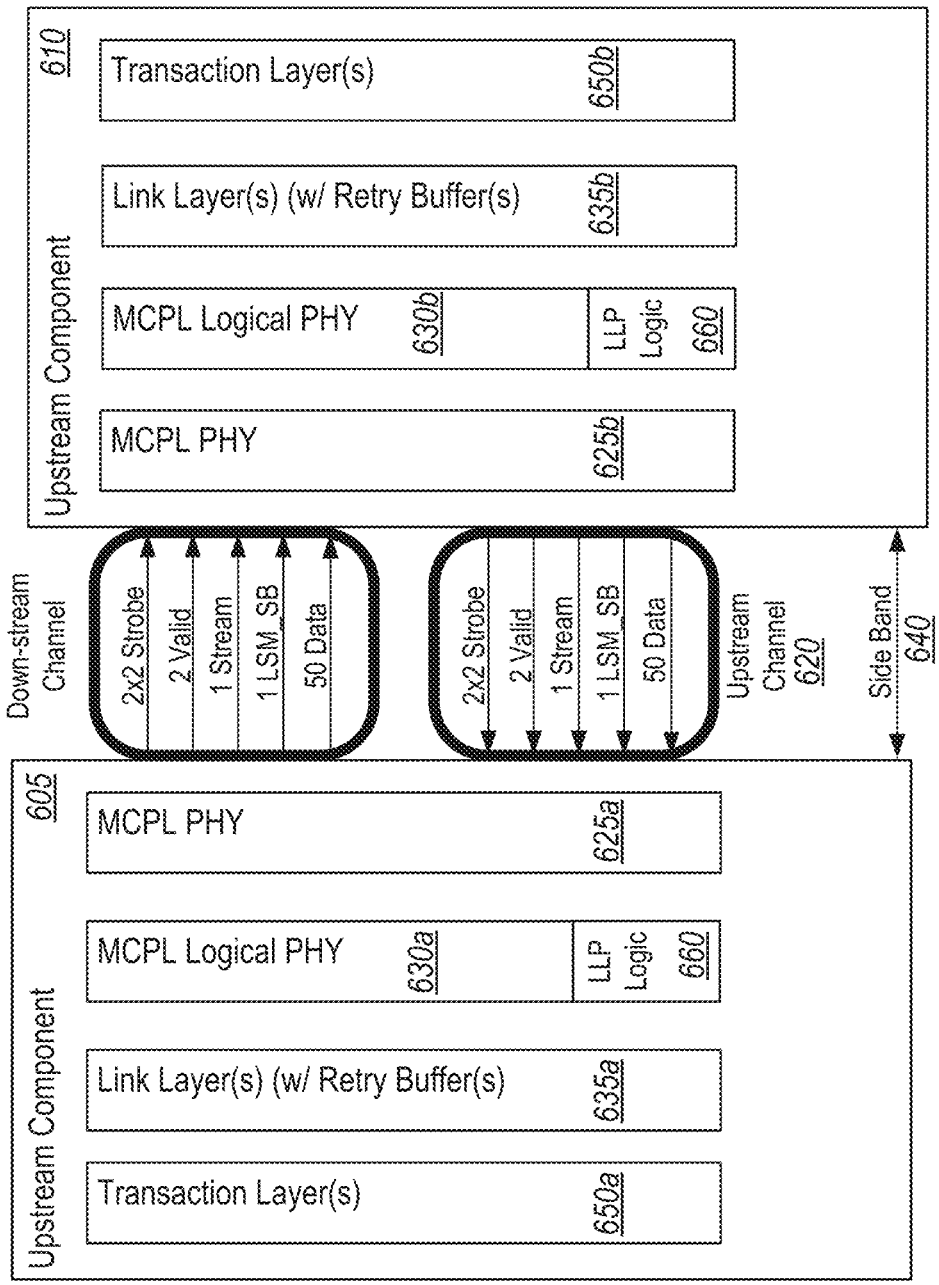
FIG. 6 is a simplified block diagram of a multichip package link (MCPL).

Turning to FIG. 6, a simplified block diagram 600 is shown representing at least a portion of a system including an example implementation of a multichip package link (MCPL). An MCPL can be implemented using physical electrical connections (e.g., wires implemented as lanes) connecting a first device 605 (e.g., a first die including one or more sub-components) with a second device 610 (e.g., a second die including one or more other sub-components). In the particular example shown in the high-level representation of diagram 600, all signals (in channels 615, 620) can be unidirectional and lanes can be provided for the data signals to have both an upstream and downstream data transfer. While the block diagram 600 of FIG. 6, refers to the first component 605 as the upstream component and the second component 610 as the downstream components, and physical lanes of the MCPL used in sending data as a downstream channel 615 and lanes used for receiving data (from component 610) as an upstream channel 620, it should be appreciated that the MCPL between devices 605, 610 can be used by each device to both send and receive data between the devices.

In one example implementation, an MCPL can provide a physical layer (PHY) including the electrical MCPL PHY 625a,b (or, collectively, 625) and executable logic implementing MCPL logical PHY 630a,b (or, collectively, 630). Electrical, or physical, PHY 625 can provide the physical connection over which data is communicated between devices 605, 610. Signal conditioning components and logic can be implemented in connection with the physical PHY 625 in order to establish high data rate and channel configuration capabilities of the link. For on-package MCPLs, tightly clustered physical connections can provided at lengths of approximately 45 mm or more. Longer lengths (i.e., multiple times longer than on-package connections (e.g., greater than 200 mm)) can be provided for off-package connections. The logical PHY 630 can include logic for facilitating clocking, link state management (e.g., for link layers 635a, 635b), and protocol multiplexing between potentially multiple, different protocols used for communications over the MCPL.

In one example implementation, physical PHY 625 can include, for each channel (e.g., 615, 620) a set of data lanes, over which in-band data can be sent. In this particular example, 50 data lanes are provided in each of the upstream and downstream channels 615, 620, although any other number of lanes can be used as permitted by the layout and power constraints, desired applications, device constraints, etc. Each channel can further include one or more dedicated lanes for a strobe, or clock, signal for the channel, one or more dedicated lanes for a valid signal for the channel, one or more dedicated lanes for a stream signal, and one or more dedicated lanes for a link state machine management or sideband signal. The physical PHY can further include a sideband link 640, which, in some examples, can be a bi-directional lower frequency control signal link used to coordinate state transitions and other attributes of the MCPL connecting devices 605, 610, among other examples.

In some implementations, data lanes can be provided as clusters, such as clusters of 4, 8, 16, 20, or 24 lanes. Multiple clusters can be assigned to implement particular portions of the MCPL (e.g., upstream or downstream data lanes, etc.). In cases where the number of data lanes is not a multiple of the size of clusters utilized to implement the data lanes (e.g., multiple clusters of 20 lanes combined to implement an MCPL of 50 lanes), remaining unused lanes (e.g., 10 extra lanes) can be dedicated to facilitate dynamic replacement of marginal lanes, allowing data of a marginal lane to be re-routed using the free "extra" lanes in a cluster. In some implementations, such as on-package MCPLs with smaller lengths, data sampling of data lanes can be completed on a per-cluster basis (e.g., all lanes in a cluster are trained together as a unitary whole) rather than training or synchronizing each lane in the cluster on a per-lane basis (as may be desirable when the MCPL connects two devices (not on-package) over longer distances, among other examples and uses.

As noted above, multiple protocols can be supported using an implementation of MCPL. Indeed, multiple, independent transaction layers 650a, 650b can be provided at each device 605, 610. For instance, each device 605, 610 may support and utilize two or more protocols, such as PCI, PCIe, QPI, Intel In-Die Interconnect (IDI), among others. IDI is a coherent protocol used on-die to communicate between cores, Last Level Caches (LLCs), memory, graphics, and IO controllers. Other protocols can also be supported including Ethernet protocol, Infiniband protocols, and other PCIe fabric based protocols. The combination of the Logical PHY and physical PHY can also be used as a die-to-die interconnect to connect a serializer/deserializer (SerDes) PHY (PCIe, Ethernet, Infiniband or other high speed SerDes) on one Die to its upper layers that are implemented on the other die, among other examples.

Logical PHY 630 can support multiplexing between these multiple protocols on an MCPL. Data of different protocols can be multiplexed to defined windows of time (or unit intervals of data), allowing these different types of data to be time-multiplexed on the same link. In one example, the dedicated stream lane can be used to assert an encoded stream signal that identifies which protocol is to apply to data sent substantially concurrently on the data lanes of the channel. Further, logical PHY 630 can be used to negotiate the various types of link state transitions that the various protocols may support or request. In some instances, LSM_SB signals sent over the channel's dedicated LSM_SB lane can be used, together with side band link 640 to communicate and negotiate link state transitions between the devices 605, 610. Further, link training, error detection, skew detection, de-skewing, and other functionality of traditional interconnects can be replaced or governed, in part using logical PHY 630. For instance, valid signals sent over one or more dedicated valid signal lanes in each channel can be used to signal link activity, detect skew, link errors, and realize other features, among other examples. In the particular example of FIG. 6, multiple valid lanes are provided per channel. For instance, data lanes within a channel can be bundled or clustered (physically and/or logically) and a valid lane can be provided for each cluster. Further, multiple strobe lanes can be provided, in some cases, also to provide a dedicated strobe signal for each cluster in a plurality of data lane clusters in a channel, among other examples.

As noted above, logical PHY 630 can be used to negotiate and manage link control signals sent between devices connected by the MCPL. In some implementations, logical PHY 630 can include link layer packet (LLP) generation logic 660 that can be used to send link layer control messages over the MCPL (i.e., in band). Such messages can be sent over data lanes of the channel, with the stream lane identifying that the data is link layer-to-link layer messaging, such as link layer control data, among other examples. Link layer messages enabled using LLP module 660 can assist in the negotiation and performance of link layer state transitioning, power management, loopback, disable, re-centering, scrambling, among other link layer features between the link layers 635a, 635b of devices 605, 610 respectively.

Figure 7:
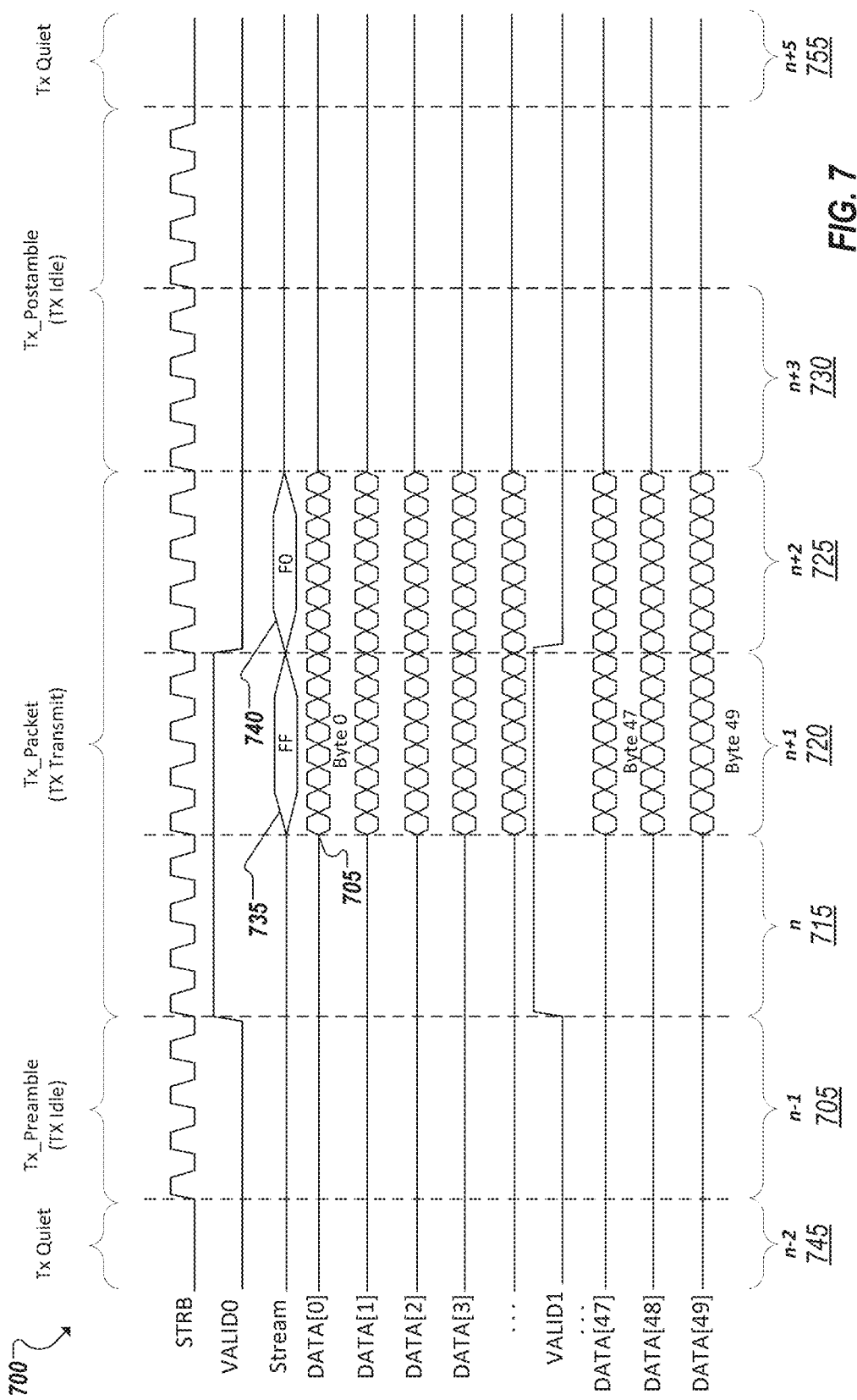
FIG. 7 is a representation of example signaling on an example MCPL.

Turning to FIG. 7, a diagram 700 is shown representing example signaling using a set of lanes (e.g., 615, 620) in a particular channel of an example MCPL. In the example of FIG. 7, two clusters of twenty-five (25) data lanes are provided for fifty (50) total data lanes in the channel. A portion of the lanes are shown, while others (e.g., DATA[4-46] and a second strobe signal lane (STRB)) are omitted (e.g., as redundant signals) for convenience in illustrating the particular example. When the physical layer is in an active state (e.g., not powered off or in a low power mode (e.g., an L1 state)), strobe lanes (STRB) can be provided with a synchronous clock signal. In some implementations, data can be sent on both the rising and falling edges of the strobe. Each edge (or half clock cycle) can demarcate a unit interval (UI), realizing a 2UI clock. Accordingly, in this example, a bit (e.g., 705) can be sent on each lane, allowing for a byte to be sent every 8UI (or every 4 clock (STRB) cycles). A byte time period 710 can be defined as 8UI, or the time for sending a byte on a single one of the data lanes (e.g., DATA[0-49]). In one example, the byte time period 710 can be defined as a signaling window in which a chunk of data of any one of a plurality of different types can be sent. Subsequent chunks, or streams, of data can be sent in subsequent, defined windows.

In some implementations, a valid signal, sent on one or more dedicated valid signal channels (e.g., VALID0, VALID1), can serve as a leading indicator for the receiving device (or "sink") to identify, when asserted (high), that data is being sent from the sending device (or "source") on data lanes (e.g., DATA[0-49]) during the immediately following data signaling window, such as a byte time period 710. Alternatively, when the valid signal is low, the source indicates to the sink that the sink will not be sending data on the data lanes during the following time period. Accordingly, when the sink logical PHY detects that the valid signal is not asserted (e.g., on lanes VALID0 and VALID1), the sink can disregard any data that is detected on the data lanes (e.g., DATA[0-49]) during the following time period. For instance, crosstalk noise or other transient bits may appear on one or more of the data lanes when the source, in fact, is not sending any data. By virtue of a low, or non-asserted, valid signal during the previous time period (e.g., the previous byte time period), the sink can determine that activity the data lanes are to be disregarded during the following time period, or signaling window.

Data sent on each of the lanes of the MCPL can be strictly aligned to the strobe signal. A time period can be defined based on the strobe, such as a byte time period, and each of these periods can correspond to a defined window in which signals are to be sent on the data lanes (e.g., DATA[0-49]), the valid lanes (e.g., VALID1, VALID2), and stream lane (e.g., STREAM). Accordingly, alignment of these signals can enable identification that a valid signal in a previous time period window applies to data in the following time period window, and that a stream signal applies to data in the same time period window. The stream signal can be an encoded signal (e.g., 1 byte of data for a byte time period window), that is encoded to identify the protocol that applies to data being sent during the same time period window. Training of an MCPL can ensure that sampling of the valid lanes and corresponding data lanes (as well as the corresponding stream lanes) are strictly aligned, given the dependence of receiving logic on the accurate timing of corresponding valid signals on the valid lanes.

As an illustrative example, as shown in FIG. 7, a byte time period signaling window is defined and data is prepared to be sent in the window. A valid is asserted at a time period window n (715), before any data is injected on data lanes DATA[0-49] during the identified window. At the following time period window n+1 (720) data is sent on at least some of the data lanes. In this case, data is sent on all fifty data lanes during n+1 (720). Because a valid was asserted for the duration of the preceding time period window n (715), the sink device can validate the data received on data lanes DATA[0-49] during time period window n+1 (720). Additionally, the leading nature of the valid signal during time period window n (715) allows the receiving device to prepare for and accurately sample the incoming data. Continuing with the example of FIG. 7, the valid signal remains asserted (on VALID1 and VALID2) during the duration of time period window n+1 (720), causing the sink device to expect the additional data (of the same or a different type) to be sent over data lanes DATA[0-49] during the immediately succeeding time period window n+2 (725). If the valid signal were to remain asserted during time period window n+2 (725), the sink device could further expect to receive (and process) additional data sent during an immediately subsequent time period window n+3 (730). In the example of FIG. 7, however, the valid signal is de-asserted following the conclusion of time period window n+1 (720) and remains low during the duration of time period window n+2 (725), indicating to the sink device that no data will be sent during time period window n+3 (730) and that any bits detected on data lanes DATA[0-49] should be disregarded during time period window n+3 (730).

As noted above, multiple valid lanes and strobe lanes can be maintained per channel. This can assist, among other advantages, with maintaining circuit simplicity and synchronization amid the clusters of relatively lengthy physical lanes connecting the two devices. In some implementations, a set of data lanes can be divided into clusters of data lanes. For instance, in the example of FIG. 7, data lanes DATA[0-49] can be divided into two twenty-five lane clusters and each cluster can have a dedicated valid and strobe lane. For instance, valid lane VALID1 can be associated with data lanes DATA[0-24] and valid lane VALID2 can be associated with data lanes DATA[25-49]. The signals on each "copy" of the valid and strobe lanes for each cluster can be identical.

As introduced above, data on stream lane STREAM can be used to indicate to the receiving logical PHY what protocol is to apply to corresponding data being sent on data lanes data lanes DATA[0-49]. In the example of FIG. 7, a stream signal is sent on STREAM during the same time period window as data on data lanes DATA[0-49] to indicate the protocol of the data on these data lanes. In alternative implementations, the stream signal can be sent during a preceding time period window, such as with corresponding valid signals, among other potential modifications. However, continuing with the example of FIG. 7, a stream signal 735 is sent during time period window n+1 (720) that is encoded to indicate the protocol (e.g., PCIe, PCI, IDI, QPI, etc.) that is to apply to the bits sent over data lanes DATA[0-49] during the same time period window n+1 (720). Similarly, another stream signal 740 can be sent during the subsequent time period window n+2 (725) to indicate the protocol that applies to the bits sent over data lanes DATA[0-49] during time period window n+2 (725), and so on. In some cases, such as the example of FIG. 7 (where both stream signals 735, 740 have the same encoding, binary FF), data in sequential time period windows (e.g., n+1 (720) and n+2 (725)) can belong to the same protocol. However, in other cases, data in sequential time period windows (e.g., n+1 (720) and n+2 (725)) can be from different transactions to which different protocols are to apply, and stream signals (e.g., 735, 740) can be encoded accordingly to identify the different protocols applying to the sequential bytes of data on the data lanes (e.g., DATA[0-49]) (such as shown in the example of FIG. 7), among other examples.

In some implementations, a low power or idle state can be defined for the MCPL. For instance, when neither device on the MCPL is sending data, the physical layer (electrical and logical) of MCPL can go to an idle or low power state. For instance, in the example of FIG. 7, at time period window n−2 (745), the MCPL is in a quiet or idle state and the strobe is disabled to save power. The MCPL can transition out of low-power or idle mode, awaking the strobe at time period window time period window n−1 (e.g., 705). The strobe can complete a transmission preamble (e.g., to assist in waking and synchronizing each of the lanes of the channel, as well as the sink device), beginning the strobe signal prior to any other signaling on the other non-strobe lanes. Following this time period window n−1 (705), the valid signal can be asserted at time period window n (715) to notify the sink that data is forthcoming in the following time period window n+1 (720), as discussed above.

The MCPL may re-enter a low power or idle state (e.g., an L1 state) following the detection of idle conditions on the valid lanes, data lanes, and/or other lanes of the MCPL channel. For instance, no signaling may be detected beginning at time period window n+3 (730) and going forward. Logic on either the source or sink device can initiate transition back into a low power state leading again (e.g., time period window n+5 (755)) to the strobe going idle in a power savings mode, among other examples and principles (including those discussed later herein).

Electrical characteristics of the physical PHY can include one or more of single-ended signaling, half-rate forwarded clocking, matching of interconnect channel as well as on-chip transport delay of transmitter (source) and receiver (sink), optimized electrostatic discharge (ESD) protection, pad capacitance, among other features. Further, an MCPL can be implemented to achieve higher data rate (e.g., approaching 16 Gb/s) and energy efficiency characteristics than traditional package I/O solutions.

Figure 8:
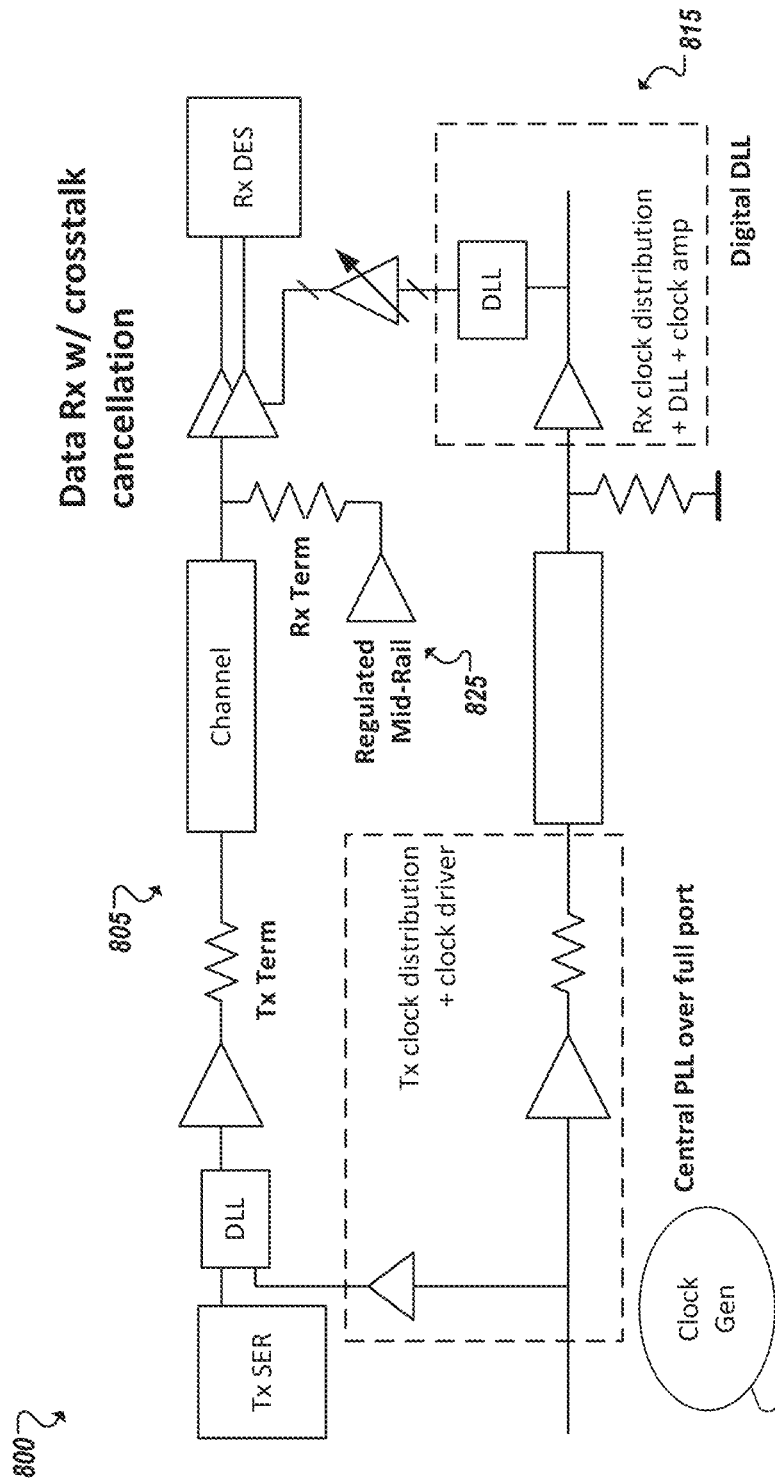
FIG. 8 is a simplified block diagram illustrating a data lane in an example MCPL.

FIG. 8 illustrates a portion of a simplified block diagram 800 representing a portion of an example MCPL. The diagram 800 of FIG. 8 includes a representation of an example lane 805 (e.g., a data lane, valid lane, or stream lane) and clock generation logic 810. As shown in the example of FIG. 8, in some implementations, clock generation logic 810 can be implemented as a clock tree to distribute the generated clock signal to each block implementing each lane of the example MCPL, such as data lane 805. Further, a clock recovery circuit 815 can be provided. In some implementations, rather than providing a separate clock recovery circuit for each lane in which the clock signal is distributed, as is customary in at least some traditional interconnect I/O architectures, a single clock recovery circuit can be provided for a cluster of a plurality of lanes. Indeed, as applied to the example configurations in FIGS. 6 and 7, a separate strobe lane and accompanying clock recovery circuit can be provided for each cluster of twenty-five data lanes.

Continuing with the example of FIG. 8, in some implementations, at least the data lanes, stream lanes, and valid lanes can be terminated, mid-rail, to a regulated voltage greater than zero (ground). In some implementations, a mid-rail voltage can be regulated to Vcc/2. In some implementations, a single voltage regulator 825 can be provided per cluster of lanes. For instance, when applied to the examples of FIGS. 6 and 7, a first voltage regulator can be provided for a first cluster of twenty-five data lanes and a second voltage regulator can be provided for the remaining cluster of twenty-five data lanes, among other potential examples. In some instances, an example voltage regulator 825 can be implemented as a linear regulator, a switched capacitor circuit, among other examples. In some implementations, the linear regulator can be provided with analog feedback loop or digital feedback loop, among other examples.

In some implementations, crosstalk cancellation circuitry can also be provided for an example MCPL. In some instances, the compact nature of the long MCPL wires can introduce crosstalk interference between lanes. Crosstalk cancellation logic can be implemented to address these and other issues. For instance, in one example illustrated in FIGS. 9-10, crosstalk can be reduced significantly with an example low power active circuit, such as illustrated in diagrams 900 and 1000. For instance, in the example of FIG. 9, a weighted high-pass filtered "aggressor" signal can be added to the "victim" signal (i.e., the signal suffering crosstalk interference from the aggressor). Each signal can be considered a victim of crosstalk from each other signal in the link, and can, itself, be the aggressor to the other signal insofar it is the source of crosstalk interference. Such a signal can be generated and reduce crosstalk on the victim lane by more than 50%, owing to the derivative nature of crosstalk on the link. The low pass filtered aggressor signal, in the example of FIG. 9, can be generated through a high-pass RC filter (e.g., implemented through C and R1) that produces the filtered signal to be added using a summing circuit 905 (e.g., RX sense-amp).

Figure 9:
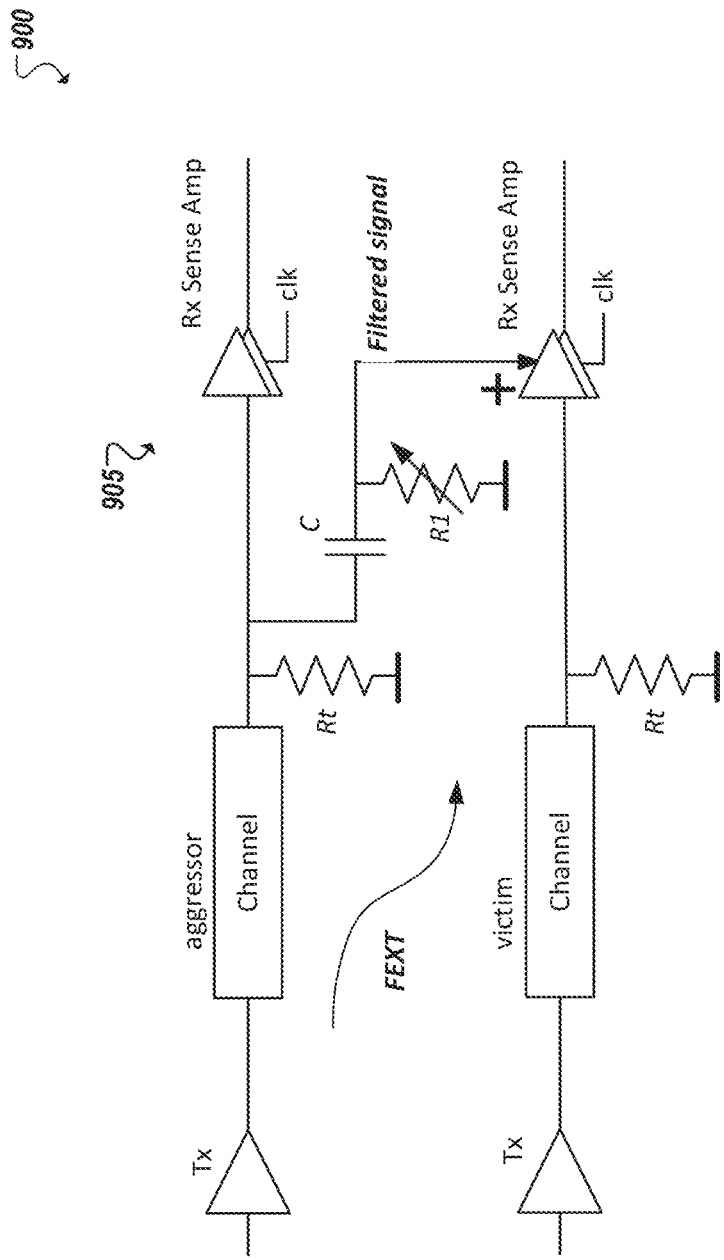
FIG. 9 is a simplified block diagram illustrating example crosstalk cancellation techniques in an embodiment of an MCPL.
Figure 10:
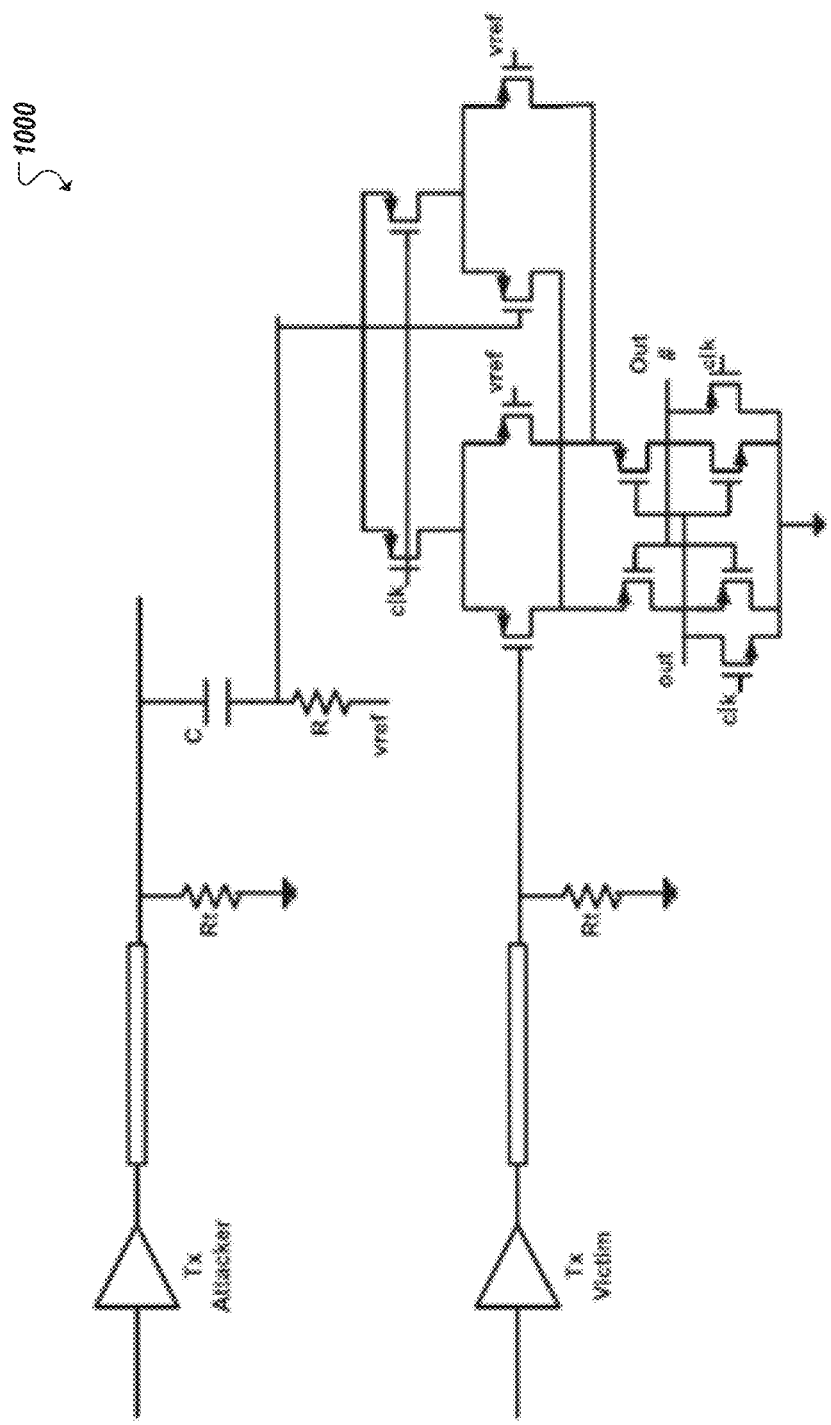
FIG. 10 is a simplified circuit diagram illustrating example crosstalk cancellation components in an embodiment of an MCPL.

Implementations similar to that described in the example of FIG. 9 can be particularly convenient solutions for an application such as MCLP, as implementation of the circuit can be realized with relatively low overhead, as illustrated in the diagram of FIG. 10 illustrating an example transistor-level schematic of the circuit shown and described in the example of FIG. 9. It should be appreciated that the representations in FIGS. 9 and 10 are simplified representations, and an actual implementation would include multiple copies of the circuits illustrated in FIGS. 9 and 10 to accommodate the network of crosstalk interference among and between the lanes of a link. As an example, in a three lane link (e.g., Lanes 0-2) circuitry similar to that described in the examples of FIGS. 9 and 10 could be provided from Lane 0 to Lane 1, from Lane 0 to Lane 2, from Lane 1 to Lane 0, from Lane 1 to Lane 2, from Lane 2 to Lane 0, from Lane 2 to Lane 1, etc. based on the geometry and the layout of the lanes, among other examples Additional features can be implemented at the physical PHY level of an example MCPL. For instance, receiver offset can introduce significant error and limit I/O voltage margin in some instances. Circuit redundancy can be used to improve receiver sensitivity. In some implementations, circuit redundancy can be optimized to address the standard deviation offset of data samplers used in the MCPL. For instance, an example data sampler can be provided that is designed to a three (3) standard deviation offset specification. In the examples of FIGS. 6 and 7, for instance, were two (2) data samplers to be used for each receiver (e.g., for each lane), one hundred (100) samplers would be used for a fifty (50) lane MCPL. In this example, the probability that one of the receiver (RX) lanes fails the three standard deviation offset specification is 24%. A chip reference voltage generator can be provided to set the offset upper-bound and move to the next data sampler on the receiver if another one of the other data samplers is found to be exceeding the bound. However, were four (4) data samplers to be used per receiver (i.e., instead of two in this example), the receiver will only fail if three out of four samplers fail. For a fifty-lane MCPL, as in the examples of FIGS. 6 and 7, adding this additional circuit redundancy can dramatically reduce the failure rate from 24% to less than 0.01%.

In still other examples, at very high data rates, per bit duty cycle correction (DCC) and deskew can be used to augment baseline per cluster DCC and deskew to improve link margin. Instead of correction for all cases, as in traditional solutions, in some implementations a low power digital implementation can be utilized that senses and corrects the outliers where the I/O lane would fail. For instance, a global tuning of the lanes can be performed to identify problem lanes within the cluster. These problem lanes can then be targeted for per-lane tuning to achieve the high data rates supported by the MCPL.

Additional features can also be optionally implemented in some examples of a MCPL to enhance the performance characteristics of the physical link. For instance, line coding can be provided. While mid-rail terminations, such as described above, can allow for DC data bus inversion (DBI) to be omitted, AC DBI can still be used to reduce the dynamic power. More complicated coding can also be used to eliminate the worst case difference of 1's and 0's to reduce, for instance, the drive requirement of mid-rail regulator, as well as limit I/O switching noise, among other example benefits. Further, transmitter equalization can also be optionally implemented. For instance, at very high data rates, insertion loss can be a significant for an in-package channel. A two-tap weight transmitter equalization (e.g., performed during an initial power-up sequence) can, in some cases, be sufficient to mitigate some of these issues, among others.

Figure 11:
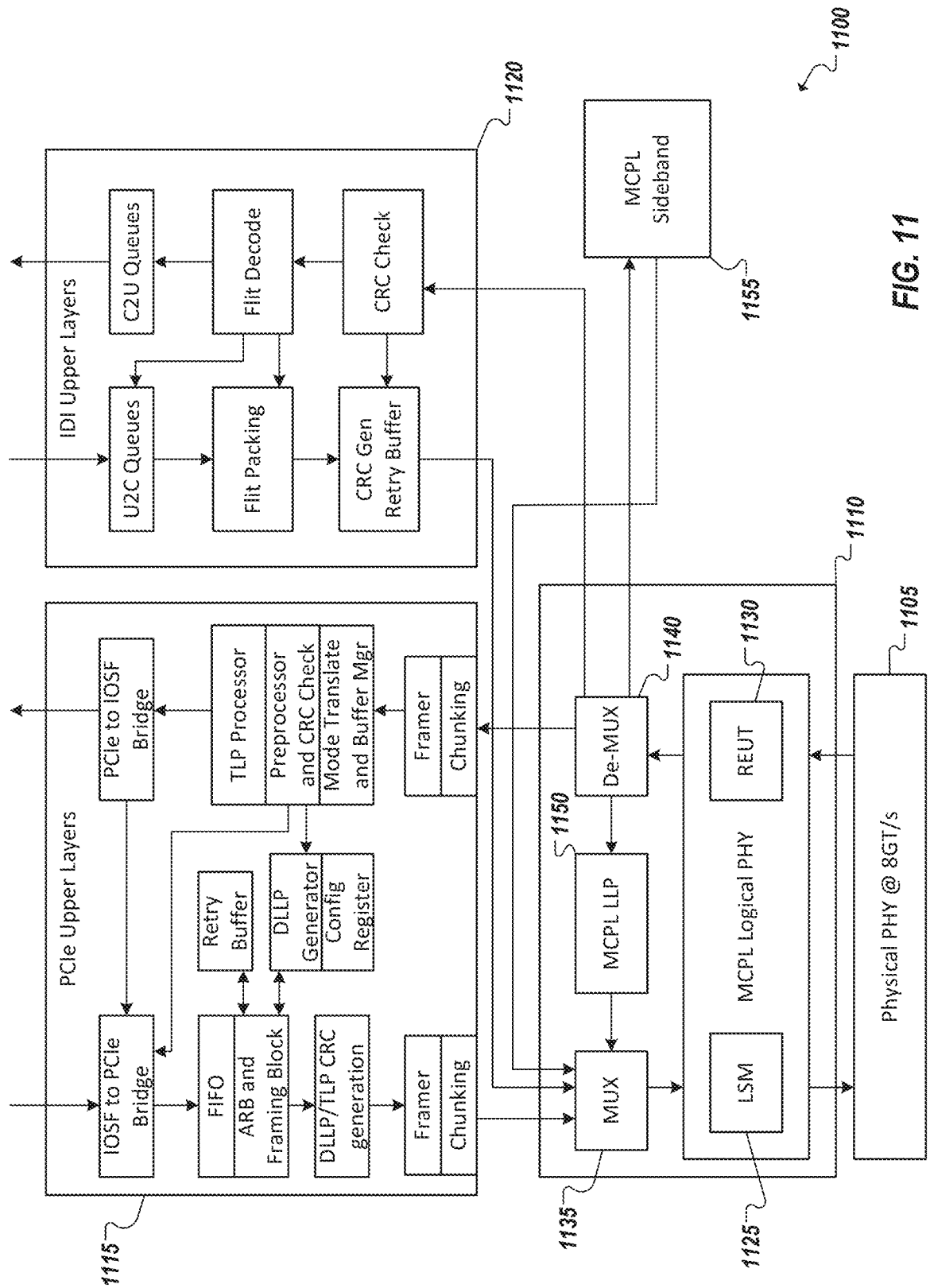
FIG. 11 is a simplified block diagram of an MCPL.

Turning to FIG. 11, a simplified block diagram 1100 is shown illustrating an example logical PHY of an example MCPL. A physical PHY 1105 can connect to a die that includes logical PHY 1110 and additional logic supporting a link layer of the MCPL. The die, in this example, can further include logic to support multiple different protocols on the MCPL. For instance, in the example of FIG. 11, PCIe logic 1115 can be provided as well as IDI logic 1120, such that the dies can communicate using either PCIe or IDI over the same MCPL connecting the two dies, among potentially many other examples, including examples where more than two protocols or protocols other than PCIe and IDI are supported over the MCPL. Various protocols supported between the dies can offer varying levels of service and features.

Logical PHY 1110 can include link state machine management logic 1125 for negotiating link state transitions in connection with requests of upper layer logic of the die (e.g., received over PCIe or IDI). Logical PHY 1110 can further include link testing and debug logic (e.g., 1130) ion some implementations. As noted above, an example MCPL can support control signals that are sent between dies over the MCPL to facilitate protocol agnostic, high performance, and power efficiency features (among other example features) of the MCPL. For instance, logical PHY 1110 can support the generation and sending, as well as the receiving and processing of valid signals, stream signals, and LSM sideband signals in connection with the sending and receiving of data over dedicated data lanes, such as described in examples above.

In some implementations, multiplexing (e.g., 1135) and demultiplexing (e.g., 1140) logic can be included in, or be otherwise accessible to, logical PHY 1110. For instance, multiplexing logic (e.g., 1135) can be used to identify data (e.g., embodied as packets, messages, etc.) that is to be sent out onto the MCPL. The multiplexing logic 1135 can identify the protocol governing the data and generate a stream signal that is encoded to identify the protocol. For instance, in one example implementation, the stream signal can be encoded as a byte of two hexadecimal symbols (e.g., IDI: FFh; PCIe: F0h; LLP: AAh; sideband: 55h; etc.), and can be sent during the same window (e.g., a byte time period window) of the data governed by the identified protocol. Similarly, demultiplexing logic 1140 can be employed to interpret incoming stream signals to decode the stream signal and identify the protocol that is to apply to data concurrently received with the stream signal on the data lanes. The demultiplexing logic 1140 can then apply (or ensure) protocol-specific link layer handling and cause the data to be handled by the corresponding protocol logic (e.g., PCIe logic 1115 or IDI logic 1120).

Logical PHY 1110 can further include link layer packet logic 1150 that can be used to handle various link control functions, including power management tasks, loopback, disable, re-centering, scrambling, etc. LLP logic 1150 can facilitate link layer-to-link layer messages over MCLP, among other functions. Data corresponding to the LLP signaling can be also be identified by a stream signal sent on a dedicated stream signal lane that is encoded to identify that the data lanes LLP data. Multiplexing and demultiplexing logic (e.g., 1135, 1140) can also be used to generate and interpret the stream signals corresponding to LLP traffic, as well as cause such traffic to be handled by the appropriate die logic (e.g., LLP logic 1150). Likewise, as some implementations of an MCLP can include a dedicated sideband (e.g., sideband 1155 and supporting logic), such as an asynchronous and/or lower frequency sideband channel, among other examples.

Logical PHY logic 1110 can further include link state machine management logic that can generate and receive (and use) link state management messaging over a dedicated LSM sideband lane. For instance, an LSM sideband lane can be used to perform handshaking to advance link training state, exit out of power management states (e.g., an L1 state), among other potential examples. The LSM sideband signal can be an asynchronous signal, in that it is not aligned with the data, valid, and stream signals of the link, but instead corresponds to signaling state transitions and align the link state machine between the two die or chips connected by the link, among other examples. Providing a dedicated LSM sideband lane can, in some examples, allow for traditional squelch and received detect circuits of an analog front end (AFE) to be eliminated, among other example benefits.

Figure 12:
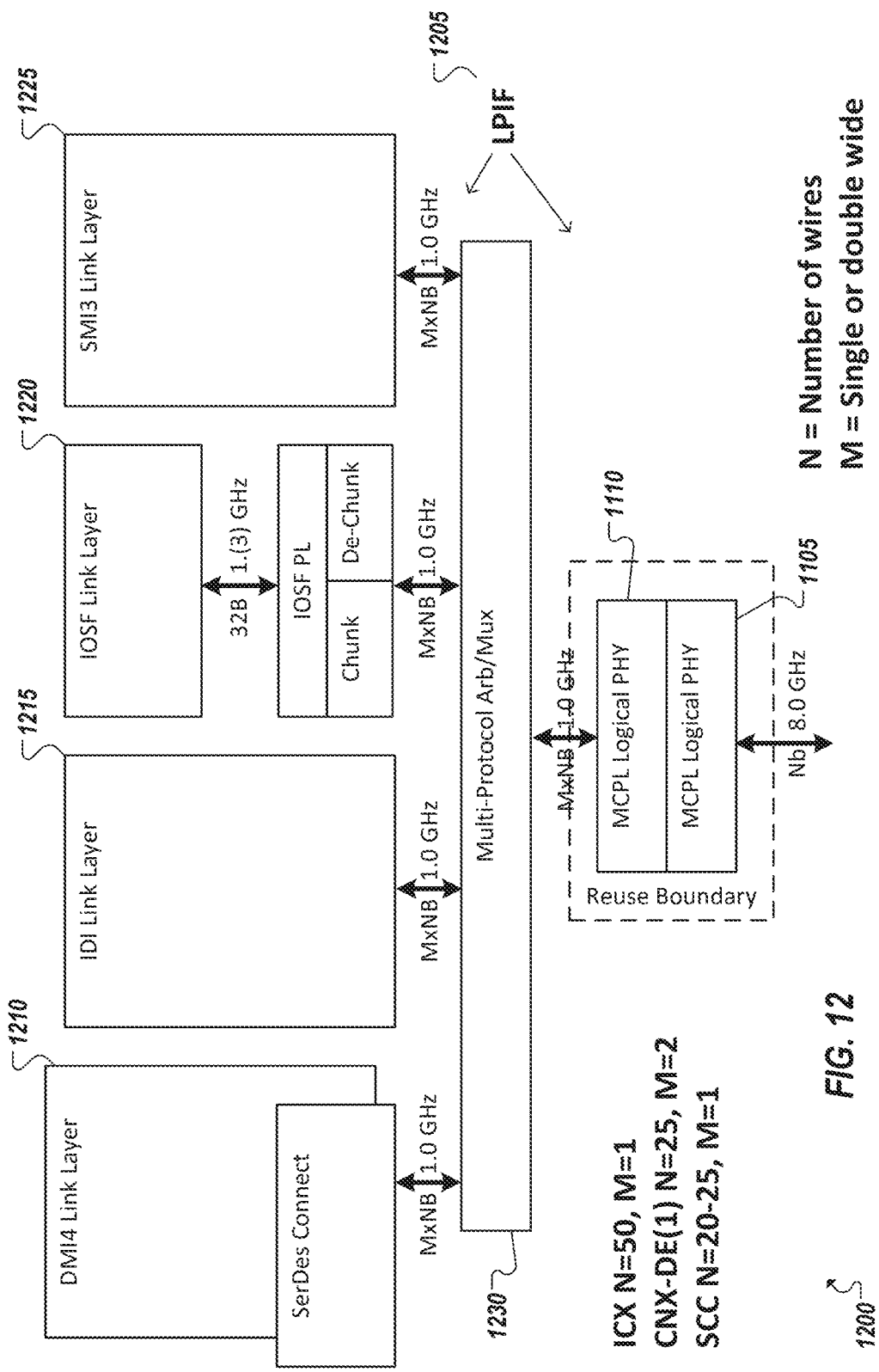
FIG. 12 is a simplified block diagram of an MCPL interfacing with upper layer logic of multiple protocols using a logical PHY interface (LPIF).

Turning to FIG. 12, a simplified block diagram 1200 is shown illustrating another representation of logic used to implement an MCPL. For instance, logical PHY 1110 is provided with a defined logical PHY interface (LPIF) 1205 through which any one of a plurality of different protocols (e.g., PCIe, IDI, QPI, etc.) 1210, 1215, 1220, 1225 and signaling modes (e.g., sideband) can interface with the physical layer of an example MCPL. In some implementations, multiplexing and arbitration logic 1230 can also be provided as a layer separate from the logical PHY 1110. In one example, the LPIF 1205 can be provided as the interface on either side of this MuxArb layer 1230. The logical PHY 1110 can interface with the physical PHY (e.g., the analog front end (AFE) 1105 of the MCPL PHY) through another interface.

The LPIF can abstract the PHY (logical and electrical/analog) from the upper layers (e.g., 1210, 1215, 1220, 1225) such that a completely different PHY can be implemented under LPIF transparent to the upper layers. This can assist in promoting modularity and re-use in design, as the upper layers can stay intact when the underlying signaling technology PHY is updated, among other examples. Further, the LPIF can define a number of signals enabling multiplexing/demultiplexing, LSM management, error detection and handling, and other functionality of the logical PHY. For instance, Table 1 summarizes at least a portion of signals that can be defined for an example LPIF:

TABLE 1

| Signal Name | Description |
| --- | --- |
| Rst | Reset |
| Lclk | Link Clock - 8UI of PHY clock |
| Pl_trdy | Physical Layer is ready to accept data, data is accepted by Physical layer when Pl_trdy and Lp_valid are both asserted. |
| Pl_data[N-1:0][7:0] | Physical Layer-to-Link Layer data, where N equals the number of lanes. |
| Pl_valid | Physical Layer-to-Link Layer signal indicating data valid |
| Pl_Stream[7:0] | Physical Layer-to-Link Layer signal indicating the stream ID received with received data |
| Pl_error | Physical layer detected an error (e.g., framing or training) |
| Pl_AlignReq | Physical Layer request to Link Layer to align packets at LPIF width boundary |
| Pl_in_L0 | Indicates that link state machine (LSM) is in L0 |
| Pl_in_retrain | Indicates that LSM is in Retrain/Recovery |
| Pl_rejectL1 | Indicates that the PHY layer has rejected entry into L1. |
| Pl_in_L12 | Indicates that LSM is in L1 or L2. |
| Pl_LSM (3:0) | Current LSM state information |
| Lp_data[N-1:0][7:0] | Link Layer-to-Physical Layer Data, where N equals number of lanes. |
| Lp_Stream[7:0] | Link Layer-to-Physical Layer signal indicating the stream ID to use with data |
| Lp_AlignAck | Link Layer to Physical layer indicates that the packets are aligned LPIF width boundary |
| Lp_valid | Link Layer-to-Physical Layer signal indicating data valid |
| Lp_enterL1 | Link Layer Request to Physical Layer to enter L1 |
| Lp_enterL2 | Link Layer Request to Physical Layer to enter L2 |
| Lp_Retrain | Link Layer Request to Physical Layer to Retrain the PHY |
| Lp_exitL12 | Link Layer Request to Physical Layer to exit L1, L2 |
| Lp_Disable | Link Layer Request to Physical Layer to disable PHY |

Figure 13:
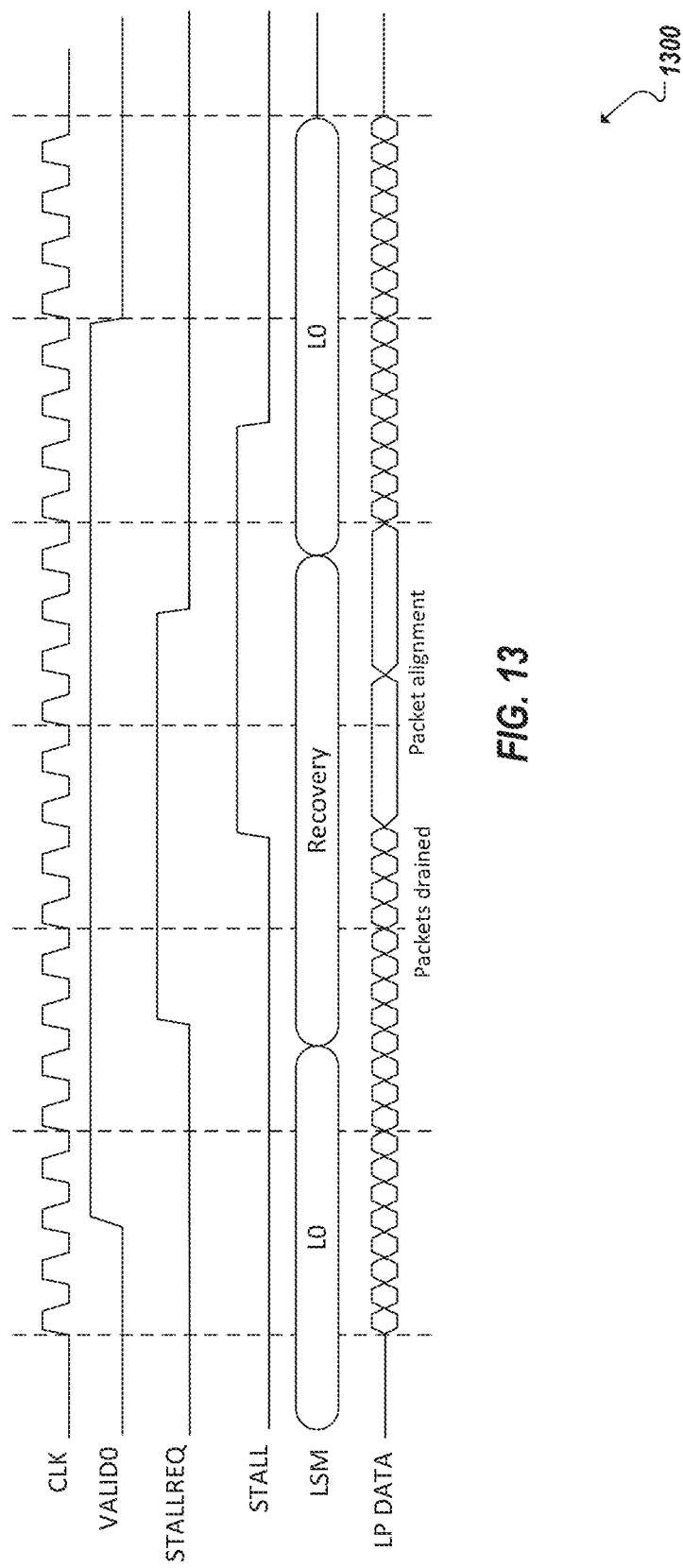
FIG. 13 is a representation of example signaling on an example MCPL in connection with a recovery of a link.

As noted in Table 1, in some implementations, an alignment mechanism can be provided through an AlignReq/AlignAck handshake. For example, when the physical layer enters recovery, some protocols may lose packet framing. Alignment of the packets can be corrected, for instance, to guarantee correct framing identification by the link layer. Additionally, as shown in FIG. 13, the physical layer can assert a StallReq signal when it enters recovery, such that the link layer asserts a Stall signal when a new aligned packet is ready to be transferred. The physical layer logic can sample both Stall and Valid to determine if the packet is aligned. For instance, the physical layer can continue to drive trdy to drain the link layer packets until Stall and Valid are sampled asserted, among other potential implementations, including other alternative implementations using Valid to assist in packet alignment.

Various fault tolerances can be defined for signals on the MCPL. For instance, fault tolerances can be defined for valid, stream, LSM sideband, low frequency side band, link layer packets, and other types of signals. Fault tolerances for packets, messages, and other data sent over the dedicated data lanes of the MCPL can be based on the particular protocol governing the data. In some implementations, error detection and handling mechanisms can be provided, such as cyclic redundancy check (CRC), retry buffers, among other potential examples. As examples, for PCIe packets sent over the MCPL, 32-bit CRC can be utilized for PCIe transaction layer packets (TLPs) (with guaranteed delivery (e.g., through a replay mechanism)) and 16-bit CRC can be utilized for PCIe link layer packets (which may be architected to be lossy (e.g., where replay is not applied)). Further, for PCIe framing tokens, a particular hamming distance (e.g., hamming distance of four (4)) can be defined for the token identifier; parity and 4-bit CRC can also be utilized, among other examples. For IDI packets, on the other hand, 16-bit CRC can be utilized.

In some implementations, fault tolerances can be defined for link layer packets (LLPs) that include requiring a valid signal to transition from low to high (i.e., 0-to-1) (e.g., to assist in assuring bit and symbol lock). Further, in one example, a particular number of consecutive, identical LLPs can be defined to be sent and responses can be expected to each request, with the requestor retrying after a response timeout, among other defined characteristics that can be used as the basis of determining faults in LLP data on the MCPL. In further examples, fault tolerance can be provided for a valid signal, for instance, through extending the valid signal across an entire time period window, or symbol (e.g., by keeping the valid signal high for eight UIs). Additionally, errors or faults in stream signals can be prevented by maintaining a hamming distance for encodings values of the stream signal, among other examples.

Implementations of a logical PHY can include error detection, error reporting, and error handling logic. In some implementations, a logical PHY of an example MCPL can include logic to detect PHY layer de-framing errors (e.g., on the valid and stream lanes), sideband errors (e.g., relating to LSM state transitions), errors in LLPs (e.g., that are critical to LSM state transitions), among other examples. Some error detection/resolution can be delegated to upper layer logic, such as PCIe logic adapted to detect PCIe-specific errors, among other examples.

In the case of de-framing errors, in some implementations, one or more mechanisms can be provided through error handling logic. De-framing errors can be handled based on the protocol involved. For instance, in some implementations, link layers can be informed of the error to trigger a retry. De-framing can also cause a realignment of the logical PHY de-framing. Further, re-centering of the logical PHY can be performed and symbol/window lock can be reacquired, among other techniques. Centering, in some examples, can include the PHY moving the receiver clock phase to the optimal point to detect the incoming data. "Optimal," in this context, can refer to where it has the most margin for noise and clock jitter. Re-centering can include simplified centering functions, for instance, performed when the PHY wakes up from a low power state, among other examples.

Other types of errors can involve other error handling techniques. For instance, errors detected in a sideband can be caught through a time-out mechanism of a corresponding state (e.g., of an LSM). The error can be logged and the link state machine can then be transitioned to Reset. The LSM can remain in Reset until a restart command is received from software. In another example, LLP errors, such as a link control packet error, can be handled with a time-out mechanism that can re-start the LLP sequence if an acknowledgement to the LLP sequence is not received.

FIGS. 14A-14C illustrate representations of example bit mappings on data lanes of an example MCPL for various types of data. For instance, an example MCPL can include fifty data lanes. FIG. 14A illustrates a first bit mapping of example 16 byte slots in a first protocol, such as IDI, that can be sent over the data lanes within an 8UI symbol, or window. For instance, within the defined 8UI window, three 16 byte slots, including a header slot, can be sent. Two bytes of data remain, in this example, and these remaining two bytes can be utilized CRC bits (e.g., in lanes DATA[48] and DATA [49]).

Figure 16:
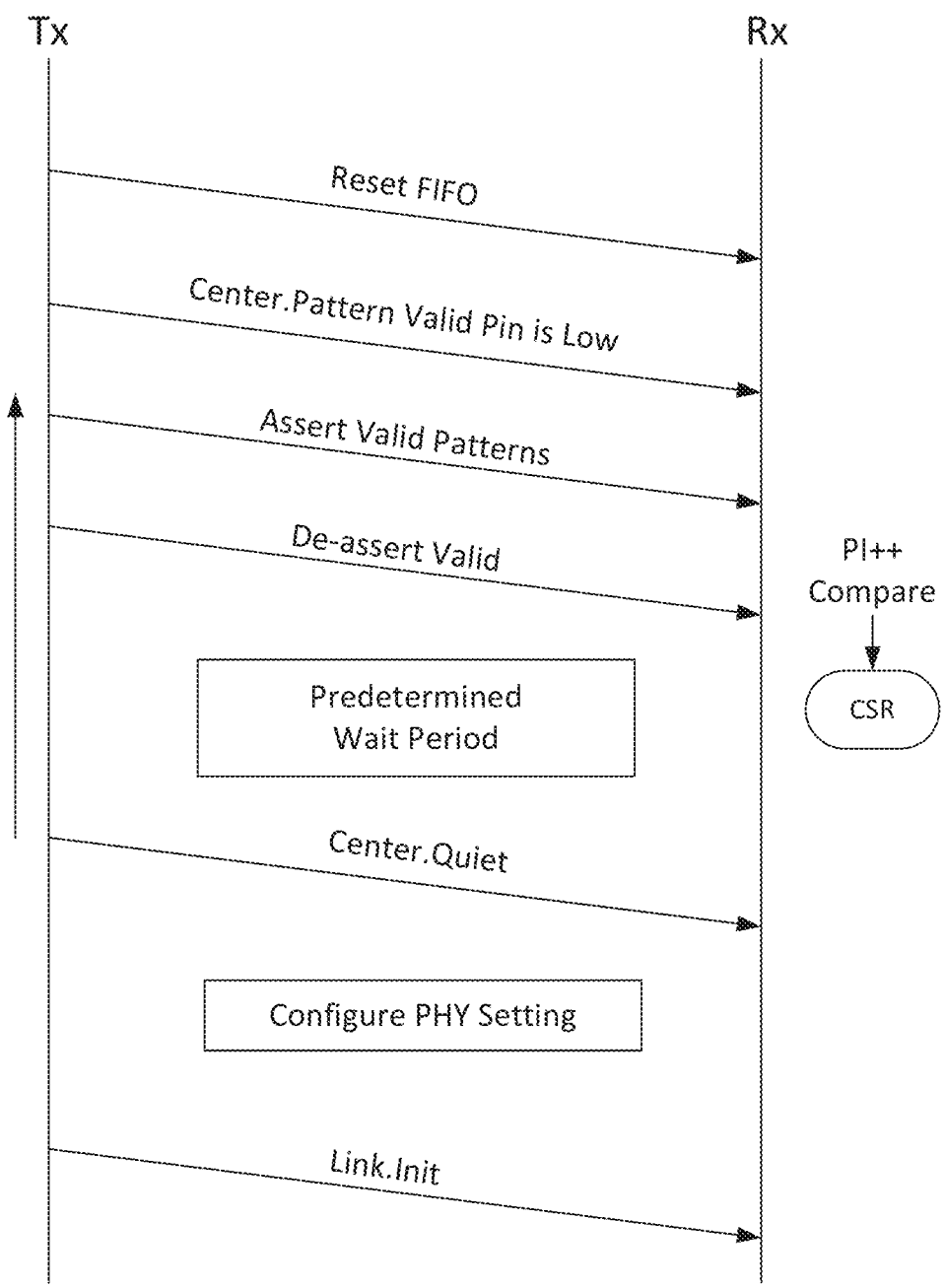
FIG. 16 is a representation of a flow associated with an example centering of a link.

In another example, FIG. 14B illustrates a second example bit mapping for PCIe packet data sent over the fifty data lanes of an example MCPL. In the example of FIG. 14B, 16 bytes packets (e.g., transaction layer (TLP) or data link layer (DLLP) PCIe packets) can be sent over the MCPL. In an 8UI window, three packets can be sent, with the remaining two bytes of bandwidth left unused within the window. Framing tokens can be included in these symbols and used to locate the start and end of each packet. In one example of PCIe, the framing utilized in the example of FIG. 14B can be the same as those token implemented for PCIe at 8 GT/s.

In yet another example, illustrated in FIG. 14C, an example bit mapping of link-to-link packets (e.g., LLP packets) sent over an example MCPL is shown. LLPs can be 4 bytes each and each LLP (e.g., LLP0, LLP1, LLP2, etc.) can be sent four consecutive times, in accordance with fault tolerance and error detection within an example implementation. For instance, failure to receive four consecutive identical LLPs can indicate an error. Additionally, as with other data types, failure to receive a VALID in a proceeding time window, or symbol, can also indicate an error. In some instances, LLPs can have fixed slots. Additionally, in this example, unused, or "spare," bits in the byte time period, can result in logical 0s being transmitted over two of the fifty lanes (e.g., DATA[48-49]), among other examples.

Figure 15:
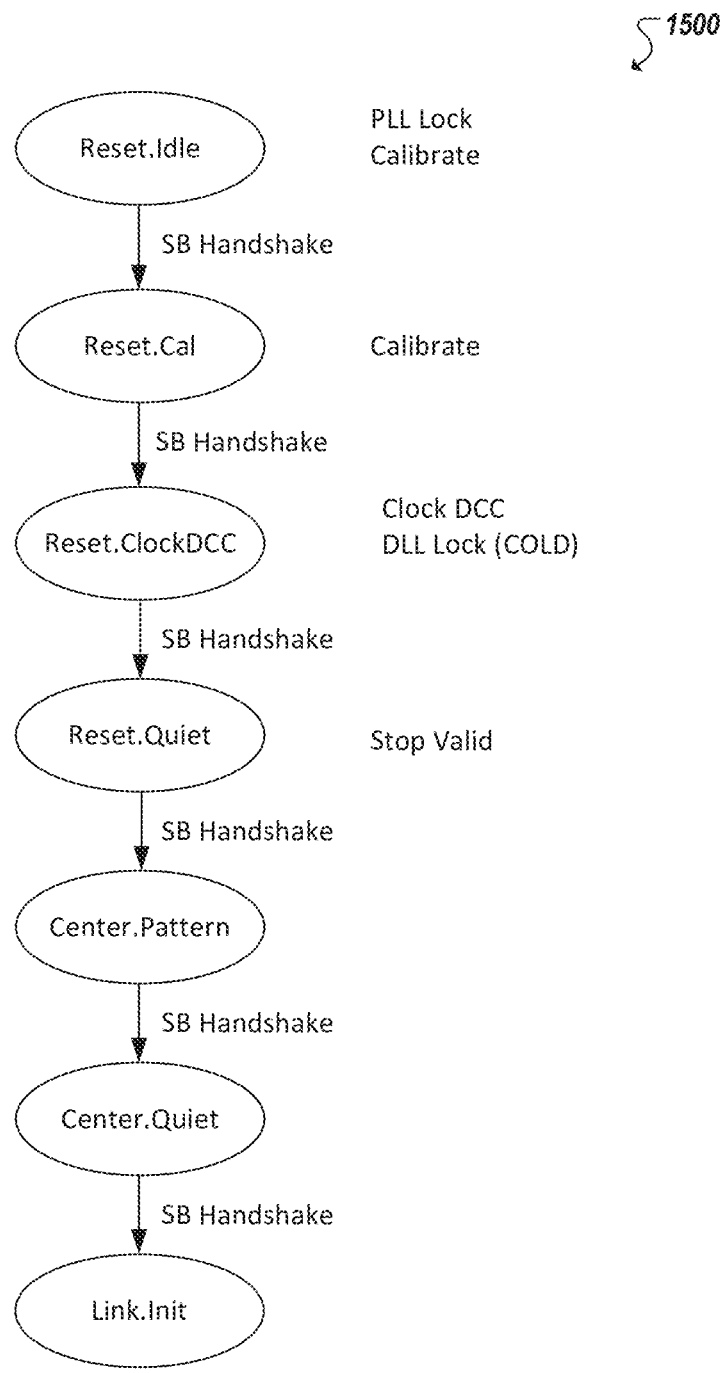
FIG. 15 is a representation of a portion of an example link state machine.

Turning to FIG. 15, a simplified link state machine transition diagram 1400 is shown together with sideband handshaking utilized between the state transitions. For instance, a Reset.Idle state (e.g., where phase lock loop (PLL) lock calibration is performed) can transition, through a sideband handshake, to a Reset.Cal state (e.g., where the link is further calibrated). Reset.Cal can transition, through a sideband handshake, to a Reset.ClockDCC state (e.g., where duty cycle correction (DCC) and delay-locked looping (DLL) lock can be performed). An additional handshake can be performed to transition from Reset.ClockDCC to a Reset.Quiet state (e.g., to deassert the Valid signal). To assist in alignment of signaling on the lanes of the MCPL, the lanes can be centered through a Center.Pattern state.

In some implementations, as shown in the example of FIG. 16, during the Center.Pattern state, the transmitter can generate training patterns or other data. The receiver can condition its receiver circuitry to receive such training patterns, for instance, by setting the phase interpolator position and vref position and setting the comparator. The receiver can continuously compare the patterns received with expected patterns and store the result in a register. After one set of patterns are complete, the receiver can increment the phase interpolator setting keeping the vref the same. The test pattern generation and comparison process can continue and new compare results can be stored in the register with the procedure repeatedly stepping through all phase interpolator values and through all values of vref. The Center.Quiet state can be entered when the pattern generation and comparison process is all complete. Following the centering of the lanes through the Center.Pattern and Center Quiet link states, a sideband handshake (e.g., using an LSM sideband signal over the dedicated LSM sideband lane of the link) can be facilitated to transition to a Link.Init state to initialize the MCPL and enable sending of data on the MCPL.

Returning momentarily to the discussion of FIG. 15, as noted above, sideband handshakes can be used to facilitate link state machine transitions between dies or chips in a multi-chip package. For instance, signals on the LSM sideband lanes of an MCPL can be used to synchronize the state machine transitions across the die. For example, when the conditions to exit a state (e.g., Reset.Idle) are met, the side that met those conditions can assert, on its outbound LSM_SB lane, an LSM sideband signal and wait for the other remote die to reach the same condition and assert an LSM sideband signal on its LSM_SB lane. When both LSM_SB signals are asserted the link state machine of each respective die can transition to the next state (e.g., a Reset.Cal state). A minimum overlap time can be defined during which both LSM_SB signals should be kept asserted prior to transitioning state. Further, a minimum quiesce time can be defined after LSM_SB is de-asserted to allow for accurate turn-around detection. In some implementations, every link state machine transition can be conditioned on and facilitated by such LSM_SB handshakes.

Figure 17:
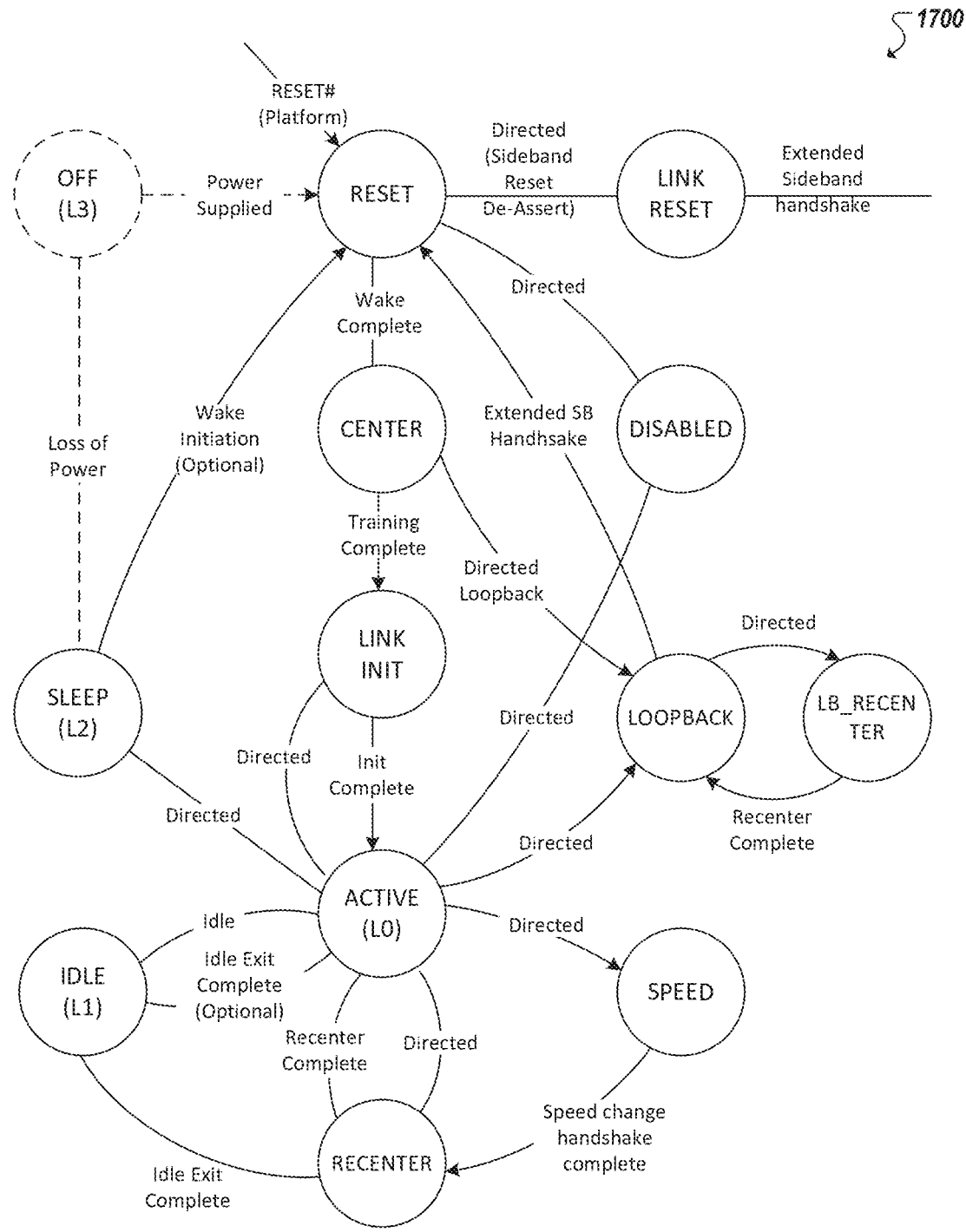
FIG. 17 is a representation of an example link state machine.

FIG. 17 is a more detailed link state machine diagram 1700, illustrating at least some of the additional link states and link state transitions that can be included in an example MCPL. Transitions between each of the link states can be facilitated through sideband handshaking provided by a sideband lane of the MCPL. In some implementations, an example link state machine can include, among the other states and state transitions illustrated in FIG. 17, a "Directed Loopback" transition can be provided to place the lanes of an MCPL into a digital loopback. For instance, the receiver lanes of an MCPL can be looped back to the transmitter lanes after the clock recovery circuits. An "LB_Recenter" state can also be provided in some instances, which can be used to align the data symbols. Additionally, as shown in FIG. 15, MCPL can support multiple link states, including an active L0 state and low power states, such as an L1 idle state, and L2 sleep state, among potentially other examples.

Figure 18:
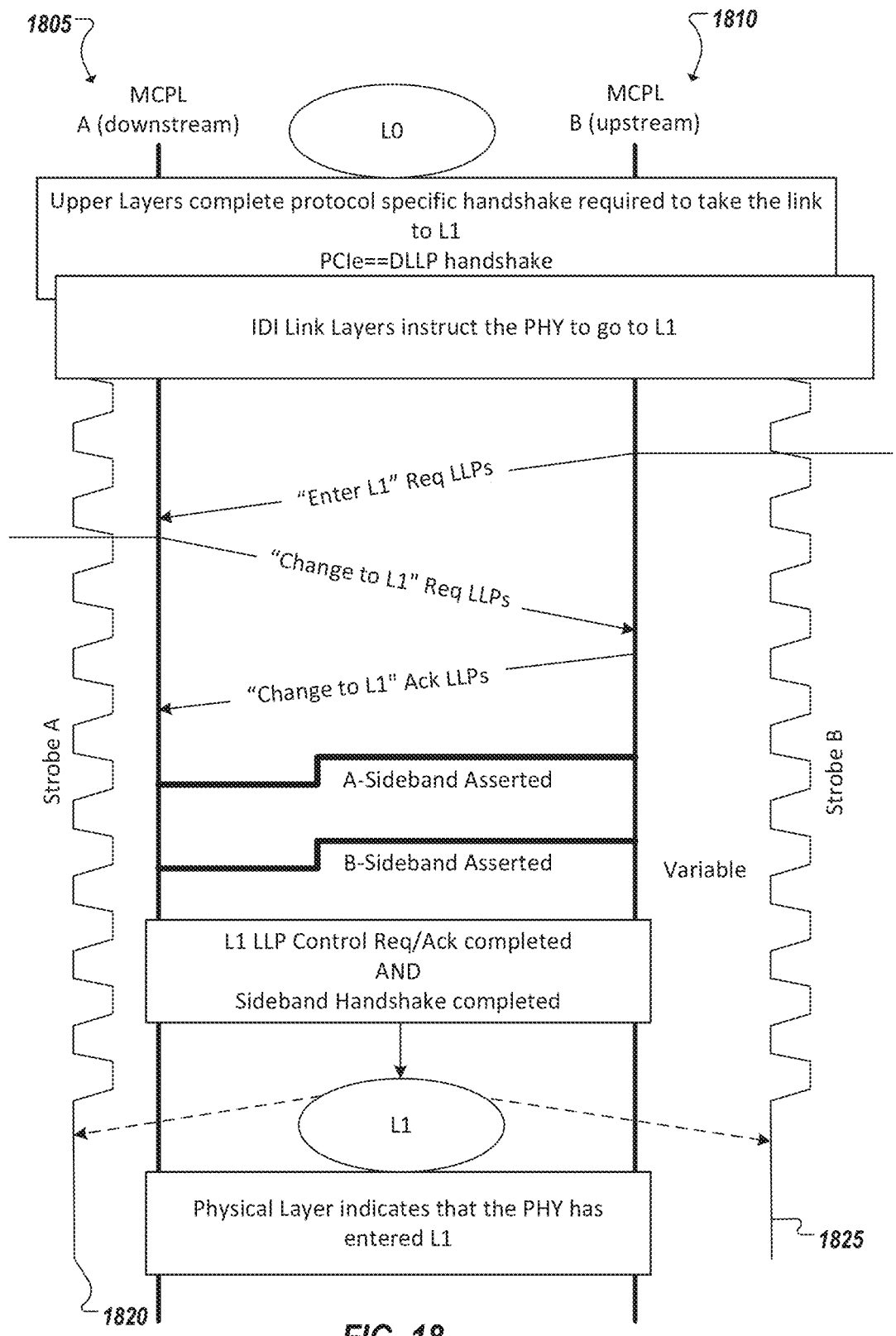
FIG. 18 is a representation of signaling to enter a low power state.

FIG. 18 is a simplified block diagram 1800 illustrating an example flow in a transition between an active state (e.g., L0) and a low-power, or idle, state (e.g., L1). In this particular example, a first device 1805 and a second device 1810 are communicatively coupled using an MCPL. While in the active state, data is transmitted over the lanes of the MCPL (e.g., DATA, VALID, STREAM, etc.). Link layer packets (LLPs) can be communicated over the lanes (e.g., data lanes, with the stream signal indicating that the data is LLP data), to assist in facilitating link state transitions. For instance, LLPs can be sent between the first and second devices 1805, 1810 to negotiate entry from L0 into L1. For instance, upper layer protocols supported by the MCPL can communicate that entry into L1 (or another state) is desired and the upper layer protocols can cause LLPs to be sent over the MCPL to facilitate a link layer handshake to cause the physical layer to enter L1. For instance, FIG. 18 shows at least a portion of LLPs sent including an "Enter L1" request LLP sent from the second (upstream) device 1810 to the first (downstream) device 1805. In some implementations, and upper level protocols, the downstream port does not initiate the entry into L1. The receiving first device 1805 can send a "Change to L1" request LLP in response, which the second device 1810 can acknowledge through a "Change to L1" acknowledgement (ACK) LLP, among other examples. Upon detecting completion of the handshake, the logical PHY can cause a sideband signal to be asserted on a dedicated sideband link to acknowledge that the ACK was received and that the device (e.g., 1805) is ready for and expecting entry into L1. For instance, the first device 1805 can assert a sideband signal 1815 sent to the second device 1810 to confirm receipt of the final ACK in the link layer handshake. Additionally, the second device 1810 can also assert a sideband signal in response to sideband signal 1815 to notify the first device 1805 of the first device's sideband ACK 1805. With the link layer control and sideband handshakes completed, the MCPL PHY can be transitioned into the L1 state causing all lanes of the MCPL to be put into idle power savings mode, including respective MCPL strobes of the 1820, 1825 of the devices 1805, 1810. The L1 can be exited upon upper level layer logic of one of the first and second devices 1805, 1810 requesting re-entry into L0, for instance, in response to detecting data to be sent to the other device over the MCPL.

As noted above, in some implementations, an MCPL can facilitate communication between two devices supporting potentially multiple different protocols, and the MCPL can facilitate communications according to potentially any one of the multiple protocols over the lanes of the MCPL. Facilitating multiple protocols, however, can complicate entry and reentry into at least some link states. For instance, while some traditional interconnects have a single upper layer protocol assuming the role of master in state transitions, an implementation of MCPL with multiple different protocols effectively involves multiple masters. As an example, as shown in FIG. 18, each of PCIe and IDI can be supported between two devices 1805, 1810 over an implementation of an MCPL. For instance, placing the physical layer into an idle or low power state may be conditioned on permission first being obtained from each of the supported protocols (e.g., both PCIe and IDI).

In some instances, entry into L1 (or another state) may be requested by only one of the multiple, supported protocols supported for an implementation of an MCPL. While there may be a likelihood that the other protocols will likewise request entry into the same state (e.g., based on identifying similar conditions (e.g., little or no traffic) on the MCPL), the logical PHY can wait until permission or instructions are received from each upper layer protocol before actually facilitating the state transition. The logical PHY can track which upper layer protocols have requested the state change (e.g., performed a corresponding handshake) and trigger the state transition upon identifying that each of the protocols have requested the particular state change, such as a transition from L0 to L1 or another transition that would affect or interfere with other protocols' communications. In some implementations, protocols can be blind as to their at least partial dependence on other protocols in the system. Further, in some instances, a protocol may expect a response (e.g., from the PHY) to a request to enter a particular state, such as a confirmation or rejection of the requested state transition. Accordingly, in such instances, while waiting for permission from other supported protocols for entry into an idle link state, the logical PHY can generate synthetic responses to a request to enter the idle state to "trick" the requesting upper layer protocol into believing that a particular state has been entered (when, in reality, the lanes are still active, at least until the other protocols also request entry into the idle state). Among other potential advantages, this can simplify coordinating entry into the low power state between multiple protocols, among other examples.

As noted above, the high bandwidth, low latency, time-multiplexed multiprotocol support provided by on-package MCPLs can be extended to off-package interconnect implementations. MCPL can be used to replace more traditional general-purpose interconnects, such as MIPI and PCIe, in at least some contexts. In some cases, off-package MCPLs can out-perform conventional external interconnects. For instance, MCPLs are multi-protocol capable while exhibiting lower power, shorter entry/exit latencies, and providing higher bandwidth per pin than many other conventional interconnects. While some channel and form factor specifications can be defined for MCPLs, on- and off-package MCPLs can be utilized in a variety of applications, from handheld mobile computers to high performance server systems.

In some instances, extending an MCPL to an off-package link can include the provisioning of additional circuitry and logic (beyond what could be used to implement an on-package MCPL) to address issues introduced by the generally longer lengths of links interconnected devices not on the same package or die. For instance, lengthening an MCPL for an off-package connection can introduce increased vulnerability to crosstalk, insertion loss (introducing inter-symbol interference), increased channel attenuation, and difficulty in realizing synchronization of lane sampling not only across the set of data lanes of the MCPL, but also between data lanes and corresponding valid lanes, among other example issues.

In one example, a combination of techniques can be utilized to address crosstalk reduction of an off-package MCPL. In one example, a passive solution can be employed for the physical MCPL lanes. For instance, stripline routing and other techniques can be used to improve the signal-to-ground ratio for the MCPL to greater than 1:2. Such improvements can provide sufficient crosstalk reduction for long MCPL channels. In some implementations, active solutions can be additionally or alternatively provided to mitigate crosstalk effect. For instance, active crosstalk reduction can be provided by enhancing MCPL receiver logic to include a high-pass filter and a summer to add a weighted derivative of an aggressor signal (e.g., the two or more) most-dominant aggressors (on other lanes)) to a victim signal (on the target lane). For instance, a the high-pass filter can be implemented as an RC filter with values of resistance (R) and capacitance (C) selected so that the filter pole frequency is higher than the signaling frequency. The summer can be implemented using a switched capacitor circuit or continuous time amplifier, among other example implementations. Indeed, the summer circuitry can be merged into a receiver sense amplifier to minimize power. The filter output can then be added to the signal of the victim lane through an extra branch in the sense amplified. Other crosstalk cancellation and mitigation techniques can be also (or instead) be utilized including Eigen-Mode signal-ingbased crosstalk cancellation techniques and extended crosstalk stress testing during link training and initialization, among other examples.

Longer MCPLs lengths can also introduce increased channel loss. Equalization techniques can be implemented in such instances to mitigate channel loss. For instance, a continuous time linear equalization (CTLE) can be added to the receiver. For instance, CTLE can be provided with a peak gain of 2, AC-to-DC peaking of 6-12 dB, and unity gain bandwidth of 16 GHz for 8 Gb/s operation. Low power CTLE can be achieved, for instance, through advanced complementary metal-oxide semiconductor (CMOS) equalization circuits, to enable less than 2 pJ/b total link power efficiency.

As noted above, synchronizing lanes of an MCPL can be important for ensuring accurate operation and sampling of the MCPL. As the length of the MCPL increases however and extend off-package, it can be more difficult to precisely match the length of lane traces. This can complicate per-bundle training of the link and corresponding channel matching. Accordingly, per-lane skew and phase adjustment can be implemented for at least some of the MCPLs implemented in a system, such as those MCPLs of longer lengths or interconnecting off-package. In one example, a phase adjustment circuit can be provided (e.g., at an off-package interface and/or MCPL-compliant off-package components) for each lane to be programmed, controlled, or otherwise managed by system management software, such as BIOS. The phase adjuster, in one example, can be implemented as a weighted inverter that controls a set of parallel N-type and P-type metal-oxide-semiconductor logic (NMOS and PMOS) with the independent enabling. Iteratively enabling different combinations of the NMOS/PMOS logic can be used to adjust the phase. Such solutions, in some implementations, can be used in lieu of a full phase interpolator (PI) (e.g., which other MCPLs (e.g., on-package links) may utilize for per-cluster phase adjustment). In such examples, system management software can drive and use a hardware phase sweep to determine the proper phase adjustment for each lane. The left and right eye margin phase adjustment positioned can be determined for each lane, allowing software to determine the optimal shift per lane to realize synchronization across the MCPL lanes. As noted above, phase interpolation can be carried out in MCPLs at a lane cluster level. Per-lane phase adjustment can be utilized in combination with per-cluster phase interpolation. For instance, phase interpolation can be carried out, first, at the cluster level, before progressing to a per-lane phase adjustment to fine-tune skew within the cluster, among other examples.

Off-package MCPL links are subject to stronger electrostatic discharge events. To address this, circuitry of off-package, MCPL-compliant devices or off-package MCPL interfaces can be provided with comparatively larger electrostatic discharge structures (ESD), among other enhancements. In total, enhancements provided at the receive, transmitter, and/or channel of an MCPL can realize longer-distance, off-package MCPLs with comparative power, latency, crosstalk, and jitter characteristics as defined or expected for short, on-package MCPLs. Indeed, in some implementations, an MCPL can have specification-defined compliance requirements and characteristics to ensure proper interoperation between devices to be interconnected using an MCPL. Compliance tests can be defined to test and approve devices (e.g., from different manufacturers or providers) for use in MCPL links.

MCPL logic and circuitry supporting off-package interconnects, such as described above, can implement MCPLs that operate within the name specifications of on-package MCPLs. For instance, a 10 dB off-package channel can be accommodated while staying within a 2 pJ/bit power envelope and supporting quick entry/exit times (e.g., 8UI), as with on-package MCPLs. Additionally, the same sideband signaling and state machine logic of on-package MCPLs can be re-used within off-package MCPLs. The MCPL sideband can allow for side-channel communications with remote die while the main link is under training or in power management mode.

Figure 20:
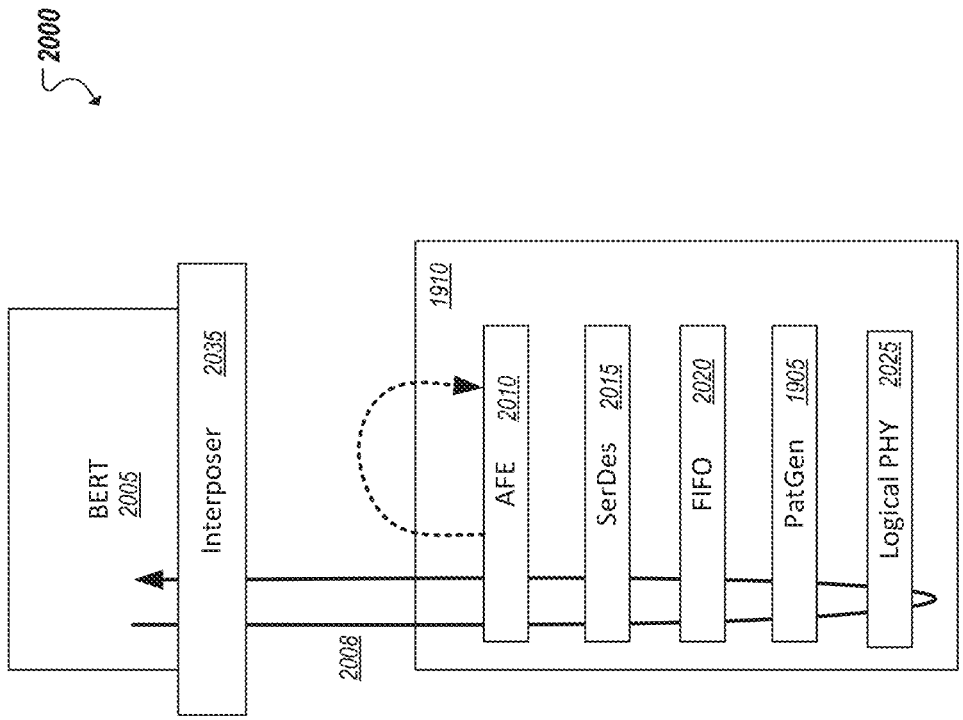
FIG. 20 is a block diagram illustrating example compliance testing of MCPL receiver logic.
Figure 19:
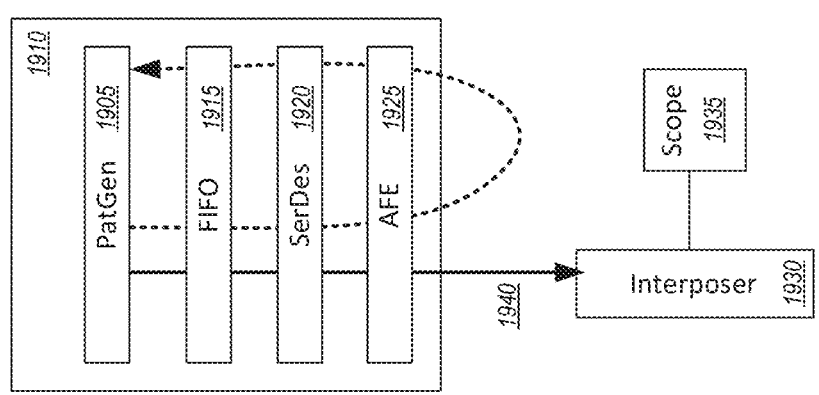
FIG. 19 is a block diagram illustrating example compliance testing of MCPL transmitter logic.

FIGS. 19-20 are simplified block diagrams 1900, 2000 illustrating examples of MCPL compliance testing, in accordance with at least some embodiments. In some cases, existing link training and testing states of the MCPL state machine can be utilized, such as loopback states and other states (such as illustrated in FIG. 17). For instance, in FIG. 19, a loopback link state can be used to test signals output by the transmitter of a device. To conduct the transmitter compliance test, the device under test (DUT) can be forced into a loopback state of the MCPL state machine. As with other link state transitions of an MCPL, a defined MCPL sideband lane can be utilized to transition the transmitter logic to the loopback state (e.g., from a reset state). In one example, as only a single component (die) may be present in the test (i.e., the DUT), the sideband handshake can be obtained by connecting the outbound sideband lane of the DUT transmitter to the inbound sideband lane of the same DUT (i.e., with the transmitter handshaking with itself to force entry into the loopback (or other test) state). Further set-up of the device under test can be conducted within an initialization quiet (INIT.QUIET) state, where the DUT link state machine is blocked due to compliance strap setting. The input for receiver lanes can be obtained from loopback, or by tying off receiver, and receiver error checking can be masked off.

Continuing with the example of FIG. 19, for transmitter testing, the DUT can act as a loopback master within the forced loopback state. Test instructions can cause a pattern generator 1905 to generate test patterns to be sent by MCPL transmitter logic of the DUT 1910. For instance, test patterns can be loaded by the transmitter logic into a buffer 1915 (e.g., first-in first-out (FIFO) buffer), passed through a SerDes 1920, to the analog front end (AFE) 1925 of the MCPL transmitter for transmission on lanes of an MCPL channel. The channel can include an interposer 1930, which can be scoped (e.g., by scope 1935) to detect the signals 1940 emerging from the transmitter port of the component to determine whether the signals are as expected (based on the provided test patterns) and the transmitter operates as would be expected by an MCPL-compliant component.

Similarly, receiver logic of an MCPL component can be tested for compliance, such as shown in FIG. 20. In this example, the DUT 1910 can again be forced into a loopback state, with the DUT acting, in the receiver compliance test, as loopback slave. A bit error rate tester (BERT) 2005, or other tester, can be connected to the receiver of the DUT. During the test, all lanes except the lane under test can be looped back and receiver lane error checking can be masked off, including error checking for valid, strobe, and stream lanes. During the test, the tester 2005 provides a test signal 2008 which is to be received and looped back by the DUT. The receiver AFE 2010 receives the test signal 2008, and remaining receiver logic (e.g., SERDES 2015, FIFO 2020) and the logical PHY 2025 process the received test pattern under loopback, with pattern generator 2030 then attempting to transmit the test signal as received. The looped-back signal can be inspected (e.g., through a scope at interposer 2035) to determine if the receiving logic of the DUT operates as expected. Additionally, the tester 2005 can introduce jitter and otherwise challenge the quality of the receiver logic though the test signals it generates and send to the DUT within the loopback testing, to ensure quality and compliance of the receiver logic, among other examples.

As noted above, an interposer (e.g., 1930, 2035) can be utilized to facilitate observation of the performance of an off-package DUT or an MCPL interface used to connect to off-package devices, among other examples allowing accessibility to device pins. In one example, an interposer board can be provided to allow access to both the transmit (Tx) and receiver (Rx) pins so that Tx output can be taken to an oscilloscope for further spec compliance analysis or Rx margin orbit-error-rate can be tested with a tester (e.g., a jitter bit error rate tester (J-BERT)). For wider usage of off-package MCPL technology, standardized pin foot-prints can be defined, such as a ball grid array (BGA) that connects the package to the printed circuit board (PCB) or an interposer, among other examples.

Figure 21:
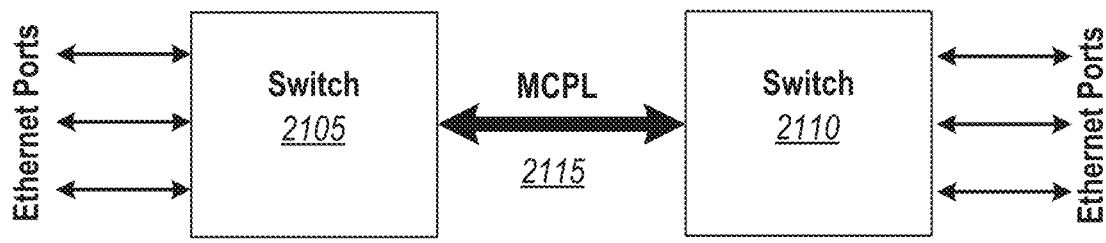
FIG. 21 is a block diagram illustrating interconnection of two switches using an example MCPL.

Off-package deployment of MCPLs can enable a variety of high speed, low power, and low latency interconnect applications. In one example, shown in FIG. 21, MCPL can be implemented to enable bit-sliced designs where multiple dies of the same type can be combined on a board to form a larger system. As one example, two Ethernet switches (e.g., 2105, 2110) can be interconnected by an MCPL 2115 to effectively form a single unified switch with twice the number of ports. The MCPL-based design, in this example, can allow a smaller die to be used for each of the switches to implement a higher radix switch without developing a new dedicated die or package design.

Figure 22:
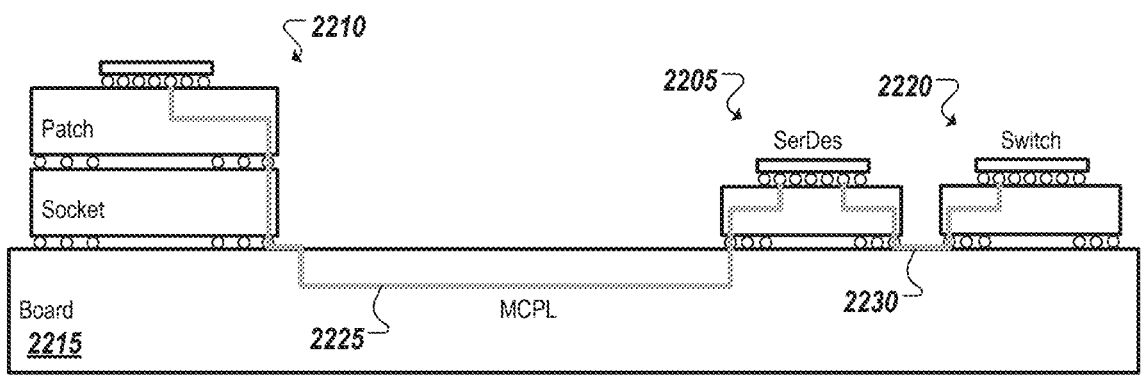
FIG. 22 is a block diagram of a portion of a circuit board utilizing an example MCPL.

In another example, the "last inch" problem facing high speed SerDes systems can be, at least in part, addressed by utilizing an off-package MCPL. For instance, as shown in the simplified block diagram 2200 of FIG. 22, the SerDes component 2205 corresponding to a device 2210 (e.g., within a high performance computer (HPC) system) can be designed to be relocated from the device 2210 (e.g., on-package) to the board 2215, such that the SerDes component 2205 is placed in close proximity to the high speed switch 2220 through which data to/from device 2210 is to be routed to other devices (e.g., processing nodes) within the HPC system. The device 2210 can include an MCPL interface to connect to its corresponding SerDes 2205 over an MCPL 2225. Data sent over the longer-distance MCPL can be at a lower data rate than data communicated between the high speed SerDes 2205 and switch 2220. By moving the SerDes 2205 closer to its link partner (e.g., switch 2220), the overall network speed can be substantially increased (e.g., doubled or more) by limiting highest-speed data rates to the shortest segment of the overall link between the device 2210 and switch 2205, thereby increasing the bisection bandwidth. Data communicated over the MCPL (i.e., the longer segment of the overall link, in this example), on the other hand, while still "high speed," can be sent at speeds multiple times lower than the data sent (over link 2230) between the SerDes 2205 and switch 2220.

In addition to the examples above, extending MCPLs off-package can realize still additional benefits and example use cases. For instance, on-package links (including MCPLs) can be subject to constrained (or relatively small) power and thermal budgets, as such budgets can be defined for the package as a whole. As an example, an encapsulated package can be constrained by its geometry and construction in its ability to shed heat and enable other benefits of more flexible design architectures. Indeed, an MCPL implemented off-package on a main die or circuit board can have larger thermal and power budgets and enable more flexibility in designing to such limits. As another example, extending MCPLs off-package can enable innovation beyond a single package provider and enable flexibility for original equipment manufacturers (OEMs) and/or end-users to support different usages with different companion dies without having to design or validate a new package. Further innovation can be provided by enabling MCPL interfaces, or "slots," to allow a package to be extended by connecting off-package using one or more MCPLs to other components, including third-party components. Such innovation can enable expansion of protocols and services provided to MCPL data, including rich coherency and I/O protocols implemented on the high speed and low power MCPL interconnect technology.

Figures 23A, 23B:
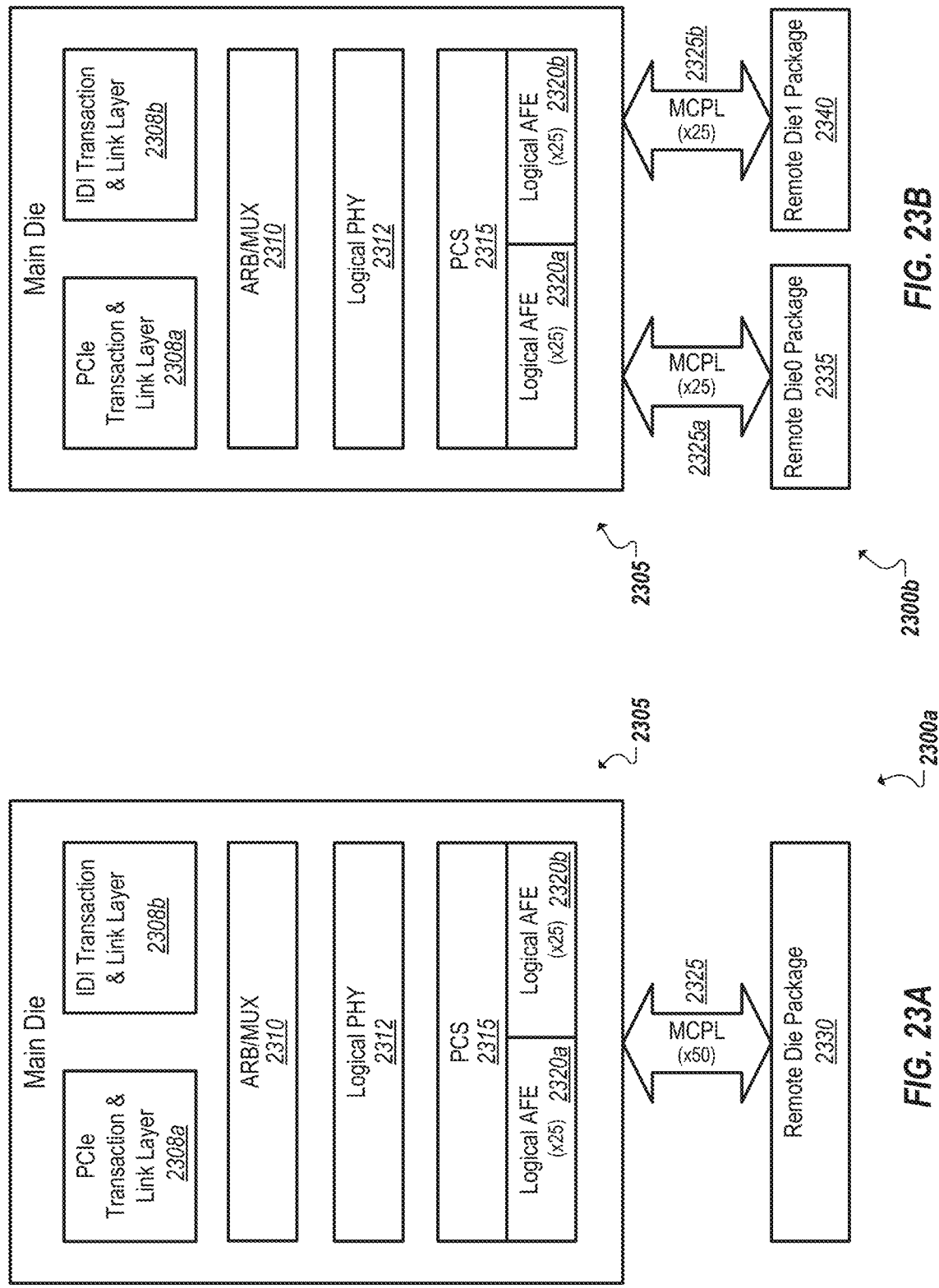
FIGS. 23A-23B are block diagrams illustrating partitioning of example MCPL logic.

Turning to FIGS. 23A-23B, simplified block diagrams 2300a-b are shown illustrating an implementation of a block of MCPL logic capable of being flexibly partitioned to support two or more separate links. MCPL logic 2305 can be implemented within a package as an interface to off-package component or in a non-package component that is to interconnect to other devices, among other examples. In this implementation, the MCPL logic 2305 can include upper layer logic to support data of two or more different interconnect protocols. For instance, MCPL logic 2305 can include upper layer logic 2308a-b of PCIe and IDI (although, in other examples, different and larger combinations of upper layer logic can be supported or provided in connection with an MCPL). Arbitration and multiplexor logic 2310 can be used to multiplex and arbitrate data of the multiple supported protocols. The logical PHY 2312 can prepare the data and cause the physical PHY, or Physical Coding Sublayer (PCS), 2315 to send the data (including corresponding strobe, stream, and valid signals) on the dedicated physical lanes of the MCPL. In this example, clusters of MCPL lanes can be defined and associated with respective logical analog front ends (AFEs) 2320a-b. In this example, each logical AFE 2320a-b is provided with a blocks of lanes that includes 25 data lanes, at least one stream lane, and at least one valid lane, at least one differential strobe, and at least one sideband lane for each direction (Rx and Tx) (e.g., at least 60 lanes for each block).

MCPL logic 2305 can be implemented to configurably support either a full-link or partitioned-link mode. In the full link mode, as shown in FIG. 23A, all of the logical AFEs 2320a-b (and the associated lanes) are utilized in a single off-package MCPL 2325 that provides 50 data lanes in each direction to connect to a single remote die package 2330. The MCPL logic, while capable of being arbitrated and operating in parallel to support multiple MCPLs, when in full-link mode, is dedicated solely to supporting the single MCPL 2325. Turning to FIG. 23B, in other implementations, the same logic 2305 can be configured (e.g., through the setting of an associated register value or other mechanism) to operate in a partitioned-link mode, as shown in the example of FIG. 23B. In partitioned-link mode, partitions in each of the sub-blocks (e.g., 2308a, 2308b, 2310, 2315) can be enforced with each partition configured to support signaling on one of the logical AFEs (e.g., 2320a or 2320b). This can allow two separate off-package MCPLs 2325a,b to be implemented, concurrently, using the same MCPL logic block 2305, each resulting MCPL 2325a,b using a respective block of lanes to provide 25 data lanes, in each direction, for a link connecting to a different, respective remote die package (e.g., 2335, 2340). Indeed, the two MCPLs 2325a,b can operate independently, for instance, on separate clocks (strobes). For instance, the two MCPLs 2325a,b can be trained independently (in cooperation with corresponding MCPL logic on their partner component 2335, 2340), one can send or receive data of one type (e.g., PCIe) while the other sends or receives data of another supported type (e.g., IDI), the two MCPLs 2325a,b can multiplexing between data types differently, transition from idle to active modes independently, among other examples.

While the example of FIG. 23B shows partitioning of a single MCPL logic block 2305 being configured to be partitioned into two equal 25 lane partitions (e.g., 2325a,b), it should be appreciated that other implementations may provide more than two blocks of lanes and logic which can be partitioned into three or more partitions. Further, some alternative implementations may provide differently sized partitions. For instance, one available partition may support a 30 data lane AFE and another partition a 20 data lane AFE, which, when in full-link mode, also provides a 50 lane AFR (and corresponding MCPLs), among other examples.

Note that the apparatus', methods', and systems described above may be implemented in any electronic device or system as aforementioned. As specific illustrations, the figures below provide exemplary systems for utilizing the invention as described herein. As the systems below are described in more detail, a number of different interconnects are disclosed, described, and revisited from the discussion above. And as is readily apparent, the advances described above may be applied to any of those interconnects, fabrics, or architectures.

Figure 24:
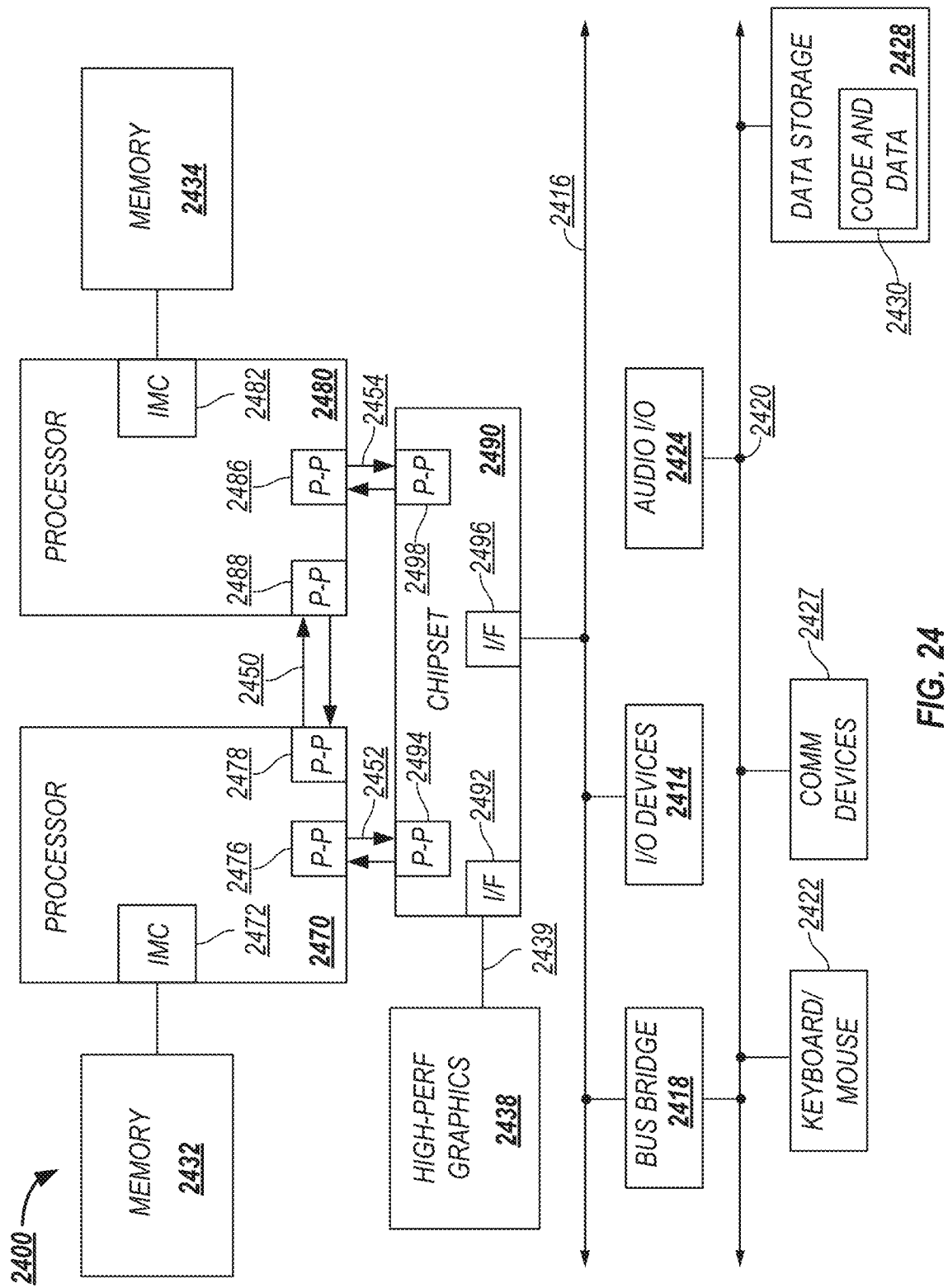
FIG. 24 illustrates an embodiment of a block for a computing system including multiple processors.

Referring to FIG. 24, block diagram of a system 2400 is shown in accordance with at least some embodiments. As shown in FIG. 24, multiprocessor system 2400 can be implemented as a point-to-point interconnect system, and include a first processor 2470 and a second processor 2480 coupled via a point-to-point interconnect 2450. Each of processors 2470 and 2480 may be some version of a processor. In one embodiment, 2452 and 2454 are part of a serial, point-to-point coherent interconnect fabric, such as a high-performance architecture.

While shown with only two processors 2470, 2480, it is to be understood that the scope of the present invention is not so limited. In other embodiments, one or more additional processors may be present in a given processor.

Processors 2470 and 2480 are shown including integrated memory controller units 2472 and 2482, respectively. Processor 2470 also includes as part of its bus controller units point-to-point (P-P) interfaces 2476 and 2478; similarly, second processor 2480 includes P-P interfaces 2486 and 2488. Processors 2470, 2480 may exchange information via a point-to-point (P-P) interface 2450 using P-P interface circuits 2478, 2488. As shown in FIG. 24, IMCs 2472 and 2482 couple the processors to respective memories, namely a memory 2432 and a memory 2434, which may be portions of main memory locally attached to the respective processors.

Processors 2470, 2480 each exchange information with a chipset 2490 via individual P-P interfaces 2452, 2454 using point to point interface circuits 2476, 2494, 2486, 2498. Chipset 2490 also exchanges information with a high-performance graphics circuit 2438 via an interface circuit 2492 along a high-performance graphics interconnect 2439.

A shared cache (not shown) may be included in either processor or outside of both processors; yet connected with the processors via P-P interconnect, such that either or both processors' local cache information may be stored in the shared cache if a processor is placed into a low power mode.

Chipset 2490 may be coupled to a first bus 2416 via an interface 2496. In one embodiment, first bus 2416 may be a Peripheral Component Interconnect (PCI) bus, or a bus such as a PCI Express bus or another third generation I/O interconnect bus, although the scope of the present invention is not so limited.

As shown in FIG. 24, various I/O devices 2414 are coupled to first bus 2416, along with a bus bridge 2418 which couples first bus 2416 to a second bus 2420. In one embodiment, second bus 2420 includes a low pin count (LPC) bus. Various devices are coupled to second bus 2420 including, for example, a keyboard and/or mouse 2422, communication devices 2427 and a storage unit 2428 such as a disk drive or other mass storage device which often includes instructions/code and data 2430, in one embodiment. Further, an audio I/O 2424 is shown coupled to second bus 2420. Note that other architectures are possible, where the included components and interconnect architectures vary. For example, instead of the point-to-point architecture of FIG. 24, a system may implement a multi-drop bus or other such architecture.

While the present invention has been described with respect to a limited number of embodiments, those skilled in the art will appreciate numerous modifications and variations therefrom. It is intended that the appended claims cover all such modifications and variations as fall within the true spirit and scope of this present invention.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present invention.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the invention may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

The following examples pertain to embodiments in accordance with this Specification. One or more embodiments may provide an apparatus, a system, a machine readable storage, a machine readable medium, and a method to provide an interconnect interface to enable communication with an off-package device over a link including a plurality of lanes. Logic of the interconnect interface can include receiver logic (implemented at least in part through hardware circuitry) to receive a valid signal from the off-package device on a dedicated valid lane of the link indicating that data is to arrive on a plurality of dedicated data lanes in the plurality of lanes, receive the data on the data lanes from the off-package device sampled based on arrival of the valid signal, and receive a stream signal from the off-package device on a dedicated stream lane in the plurality of lanes, the stream signal corresponding to the data and indicates a particular data type of the data. The particular data type can be one of a plurality of different data types capable of being received on the plurality of data lanes on the link.

In one example, the receiver logic is to determine a start of the data based on a start and duration of the valid signal.

In one example, the data is defined to be received following a number of unit intervals of the valid signal.

In one example, the stream signal is received concurrently with data to correspond to the data.

In one example, the interconnect interface further includes state machine logic to transition between a plurality of link states based on sideband signals received from the off-package device over a sideband lane in the plurality of lanes.

In one example, the state machine logic is further to cause handshake signals to be sent to the off-package device to facilitate the transitions between the plurality of link states.

In one example, each of the valid signal, the data, and the stream signal are sent in a respective one of a series of defined signaling windows for the link, and each of the defined signaling windows is of equal duration.

In one example, the valid signal is sent in a first one of the series of signaling windows, and the data and stream signal are to be sent in a second one of the series of signaling windows immediately succeeding the first signaling window.

In one example, the data includes first data and the stream signal includes a first stream signal. The receiver logic can be further configured to receive second data over at least a portion of the plurality of data lanes in a third one of the series of signaling windows immediately succeeding the second signaling window, the second data being another one of the plurality of data types, and receive a second stream signal over the stream lane in the third signaling window, the second stream signal indicating the other data type. The valid signal is to remain asserted through at least the second signaling window to indicate the first and second data.

In one example, two on-package components are provided that are connected using an on-package link including another plurality of data lanes, an instance of the valid lane, and an instance of the stream lane, and the receiver logic is based on receiver logic for the on-package link.

In one example, the receiver logic is further to train the plurality of lanes to synchronize sampling phase for each lane, where phase control is performed on a per-lane basis for the plurality of lanes.

In one example, each of the plurality of data types correspond to a respective one of a plurality of different protocols.

In one example, upper layer protocol logic of each of the plurality of different protocols, where the stream signal is used to invoke upper layer protocol logic corresponding to the data type indicated in the stream signal.

In one example, data appearing on the data lanes is to be ignored within a particular signaling window immediately following a preceding window in which the valid signal is not asserted.

One or more embodiments may provide an apparatus, a system, a machine readable storage, a machine readable medium, and a method to provide an interconnect interface to enable communication with an off-package device over a link including a plurality of lanes, the interconnect interface including transmitter logic (implemented at least in part through hardware circuitry) to send a valid signal to the off-package device on a dedicated valid lane of the link indicating to the off-package device that data is to be sent to the off-package device on a plurality of dedicated data lanes in the plurality of lanes, send the data on the data lanes to the off-package device, and send a stream signal to the off-package device on a dedicated stream lane in the plurality of lanes. The stream signal can correspond to the data and indicate a particular data type of the data, and the particular data type can be one of a plurality of different data types capable of being communicated on the plurality of data lanes on the link.

In one example, the plurality of lanes includes a second plurality of data lanes, a second valid lane, and a second stream lane, the second plurality of data lanes, the second valid lane, and the second stream lane are coupled to another off-package device, and the receiver logic is partitioned and includes arbitration logic to concurrently send different data streams to the particular off-package device and the other off-package device using the plurality of lanes.

In one example, each of the plurality of data types correspond to a respective one of a plurality of different protocols and the transmitter logic includes upper layer protocol logic of each of the plurality of different protocols.

In one example, state machine logic is provided to transition between a plurality of link states based on sideband signals communicated with the off-package device over a sideband lane in the plurality of lanes.

One or more embodiments may provide a system including a first device, a second device remote from the first device, and a link connecting the first device to the second device. The link can include a plurality of lanes and the plurality of lanes can include a plurality of data lanes, a valid lane, and a stream lane. Data is to be sent from the first device to the second device using the plurality of data lanes, the stream lane is to be used to send a stream signal to indicate a type of the data from a plurality of types, and the valid lane is to be used to send a valid signal to indicate that the data is to be sent in an immediately subsequent signaling window.

In one example, the first device includes a processor and the second device includes a serializer/deserializer (SerDes), the link includes a first link, the system further includes a high speed switch coupled to the SerDes by a second link, and the second link is shorter than the first link.

In one example, the second device includes continuous time linear equalization circuitry.

In one example, the link utilizes stripline routing through a circuit board.

In one example, the system includes the circuit board.

In one example, the link further includes a sideband lane to be used to send sideband handshake signals to facilitate link state transitions for the link.

In one example, the link includes a first link and the first device includes at least two components interconnected by a second link, the second link including a respective plurality of data lanes, a respective valid lane, and a respective stream lane.

In one example, the first link and second link both operate within a common channel attenuation and power envelope.

In one example, the first link is at least three times longer than the second link.

In one example, the plurality of data lanes include a first plurality of data lanes, the valid lane includes a first valid lane, and the stream lane includes a first stream lane, the plurality of lanes includes a second plurality of data lanes, a second valid lane, and a second stream lane, the first device includes transmitter logic to transmit data using the plurality of lanes, and the transmitter logic is partitionable.

In one example, the transmitter logic, when partitioned, supports coupling to two or more devices, including the second device, using the plurality of lanes, where the second plurality of data lanes, the second valid lane, and the second stream lane are used to connect the first device to a third device.

In one example, the transmitter logic, when is a full link mode, is unpartitioned, and the link includes the first and second pluralities of data lanes, the first and second valid lanes, and the first and second stream lanes.

In one example, the system further includes a system manager, implemented at least in part in software, to assist in adjusting phase of each of the lanes in the plurality of lanes such that sampling of the plurality of lanes is synchronized.

In one example, the first device includes a first switch and the second device includes second switch and interconnecting the first and second switches with the link implements a high radix switch.

In one example, each of the first and second switch are Ethernet switches.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   an integrated circuit package; and
   a physical layer interface to couple the integrated circuit package to an interface of another integrated circuit package over a link, wherein the physical layer interface comprises:
   a set of clock interface conductors to support a clock signal;
   a set of control interface conductors to support a set of control signals, wherein the set of control signals comprise control signals to cause transitions in link states according to a state machine;
   a plurality of data conductors to transmit data; and
   a set of valid signal conductors to support transmission of a valid signal, wherein transmission of data on the data lanes is to be aligned with transmission of the valid signal on the valid signal channel.

2. The apparatus of claim 1, wherein the data comprises a packet.

3. The apparatus of claim 1, further comprising physical layer circuitry to generate the valid signal.

4. The apparatus of claim 3, wherein the physical layer circuitry is further to manage training of the link.

5. The apparatus of claim 4, wherein training of the link comprises communicating training sequences over the physical layer interface.

6. The apparatus of claim 3, wherein the physical layer circuitry is further to manage a state machine, the state machine defines a plurality of link states for the physical layer interface.

7. The apparatus of claim 6, wherein the plurality of link states comprise an active link state, a low-power link state, and a down link state.

8. The apparatus of claim 1, wherein the physical layer interface comprises a physical layer abstraction.

9. The apparatus of claim 1, wherein transmission of the data is aligned with transmission of the valid signal by timing a beginning of the data with a beginning of the corresponding valid signal.

10. The apparatus of claim 1, wherein the physical layer interface further comprises:
   an other set of lanes to receive data; and
   another valid signal channel corresponding to the other set of lanes to indicate whether data received on the other set of lanes comprises valid data.

11. An apparatus comprising:
   an integrated circuit package; and
   a physical layer interface to couple the integrated circuit package to an interface of another integrated circuit package over a link, wherein the physical layer interface comprises:
      a set of control conductors to support a set of control signals, wherein the set of control signals comprise control signals to cause transitions in link states according to a state machine;
      a plurality of data lanes to receive data from components of the other integrated circuit package; and
      a set of valid signal conductors to support receipt of a valid signal, wherein the valid signal indicates whether data received on the plurality of data lanes comprises valid data, and receipt of data on the plurality of data lanes is to be aligned with transmission of the valid signal on the valid signal channel.

12. The apparatus of claim 11, wherein the physical layer interface further comprises a clock interface to support a clock signal.

13. The apparatus of claim 11, further comprising physical layer circuitry to identify receipt of the valid signal on the valid signal channel, and process the data received on the plurality of data lanes based on receipt of the valid signal.

14. The apparatus of claim 11, wherein the valid signal is aligned with an edge of the clock signal.

15. The apparatus of claim 11, wherein the data is according to a protocol, and the protocol comprises one of a plurality of different interconnect protocols supported using the physical layer interface.

16. A method comprising:
   identifying a clock signal for an interface, wherein the interface is to couple an integrated circuit package to another device outside the integrated circuit package over a physical link, the interface comprises a set of control channels, a valid channel, and a separate plurality of data lanes;
   sending a control signal over the link on a control channel of the interface, wherein the control signal is to cause transitions in link states according to a state machine;
   identifying particular data to be sent to the other device;
   sending a valid signal over the link on a dedicated valid channel of the interface, wherein the valid signal corresponds to the particular data; and
   sending the particular data over the link on the plurality of data lanes to align with the valid signal.

17. A system comprising:
   a computing device;
   an integrated circuit package comprising:
      computing hardware; and
      a physical layer interface to couple the integrated circuit package to the computing device over a physical interconnect, wherein the physical layer interface comprises:
      a clock lane to support a clock signal;
      a control interface comprising one or more control lanes to support a set of control signals, wherein the set of control signals comprise control signals to cause transitions in link states according to a state machine;
      a plurality of data lanes to transmit data; and
      a valid signal channel comprising one or more valid lanes to support transmission of a valid signal, wherein transmission of data on the data lanes is to be aligned with transmission of the valid signal on the valid signal channel.

18. The system of claim 17, wherein the computing device comprises a processor.

19. The system of claim 17, wherein the computing hardware of the integrated circuit package comprises a processor device.

20. The system of claim 19, wherein the computing device comprises a memory controller.

21. The system of claim 19, wherein the computing device comprises a graphics processor.

22. The system of claim 19, wherein the computing device comprises a network controller.

* * * * *